(12) United States Patent
Miyajima

(10) Patent No.: US 7,289,194 B2
(45) Date of Patent: Oct. 30, 2007

(54) POSITIONING APPARATUS, EXPOSURE APPARATUS, AND DEVICE MANUFACTURING METHOD

(75) Inventor: Yoshikazu Miyajima, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 309 days.

(21) Appl. No.: 11/127,154

(22) Filed: May 12, 2005

(65) Prior Publication Data

US 2005/0255624 A1 Nov. 17, 2005

(30) Foreign Application Priority Data

May 17, 2004 (JP) ............................. 2004-146639

(51) Int. Cl.
*G03B 27/58* (2006.01)
*G01B 11/00* (2006.01)

(52) U.S. Cl. ....................................... 355/72; 356/401

(58) Field of Classification Search .................. 355/72, 355/53; 356/399, 400, 401; 310/12; 396/611
See application file for complete search history.

(56) References Cited

U.S. PATENT DOCUMENTS 6,262,796 B1 * 7/2001 Loopstra et al. .............. 355/53

FOREIGN PATENT DOCUMENTS

JP 2001-203140 7/2001

* cited by examiner

*Primary Examiner*—Peter B. Kim
(74) *Attorney, Agent, or Firm*—Fitzpatrick, Cella, Harper & Scinto

(57) ABSTRACT

A positioning apparatus including first and second bases, and two moving elements which are guided by the first and second bases to move on the first and second bases. The two moving elements are supported on the first and second bases by air bearings. A distance is ensured between the first and second bases, and when the two moving elements move between the first and second bases, both a guide surface of the first base and a guide surface of the second bases are used. Also, pneumatic pressures of the air bearings are increased to be higher than that in a case in which the moving elements move on the first and second bases.

11 Claims, 19 Drawing Sheets

ENLARGED VIEW OF PORTION B

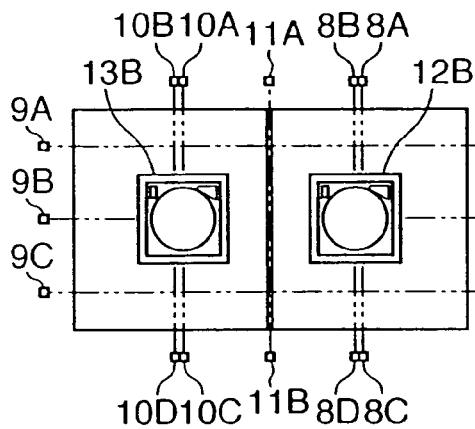
F I G. 11A
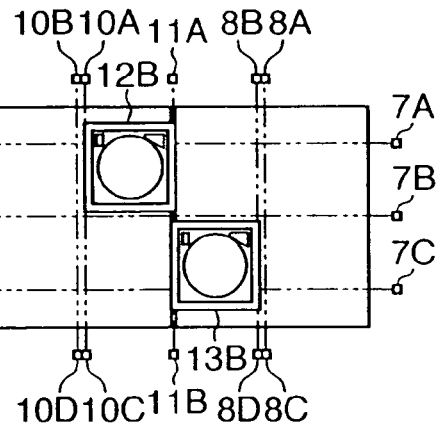
F I G. 11D
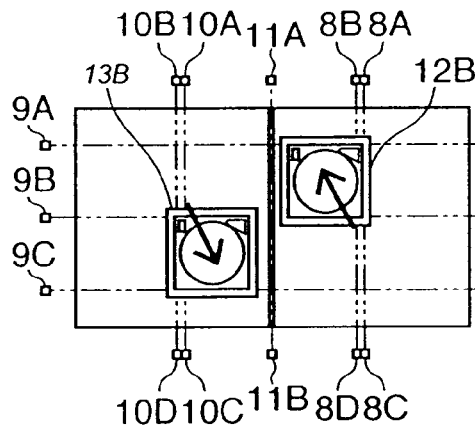
F I G. 11B
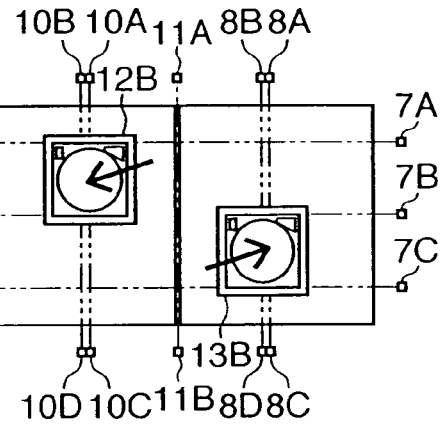
F I G. 11E
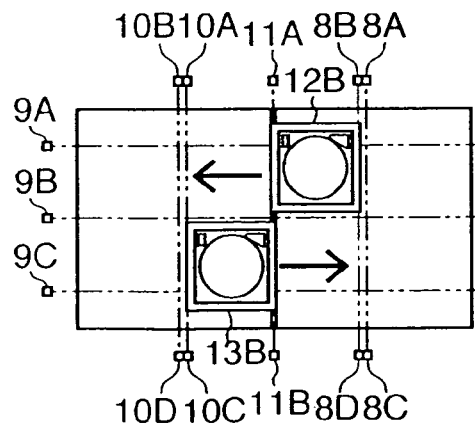
F I G. 11C
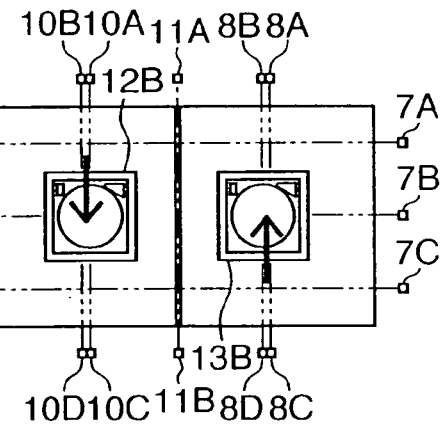
F I G. 11F

BASE SEPARATING PORTION

POSITIONING APPARATUS, EXPOSURE APPARATUS, AND DEVICE MANUFACTURING METHOD

FIELD OF THE INVENTION

The present invention relates to a positioning apparatus for positioning two moving elements, an exposure apparatus into which the positioning apparatus is built, and a device manufacturing method which uses the exposure apparatus.

BACKGROUND OF THE INVENTION

In the manufacture of various types of devices, such as semiconductor devices, an exposure apparatus which forms a latent pattern on a photosensitive agent applied to a substrate is used. The latent pattern is patterned in a later developing step. One of the important factors in the exposure apparatus can include an exposure processing ability, i.e., the throughput.

As a scheme that greatly improves the throughput, a scheme is available which simultaneously performs an alignment process (a measurement process for alignment) and an exposure process (a process of forming a latent pattern on a substrate while positioning the substrate on the basis of information obtained by the alignment process). According to this scheme, two stages are provided. The alignment process is performed for a substrate on the stage in an alignment process area, and the exposure process is performed for a substrate on the stage in an exposure process area. When the simultaneous processes are ended, the stage which holds the aligned substrate is moved from the alignment process area into the exposure process area, and the stage which holds the exposed substrate is moved from the exposure process area into the alignment process area.

According to this scheme, the two stages must be swapped between the alignment process area and the exposure process area. An exposure apparatus is available which moves two stages on one stage base in order to swap them. If the two stages are arranged on one stage base, when the alignment process and exposure process are to be performed simultaneously, vibration which can be caused by a reaction force generated upon driving one stage adversely affects driving and positioning of the other stage. More specifically, the reaction force which accompanies driving of one stage can decrease the positioning accuracy of the other stage, or prolong the settling time during positioning.

Japanese Patent Laid Open No. 2001-203140 discloses the following exposure apparatus. Two stage bases are arranged on a base plate. A stage main body which is movable in X and Y directions is arranged on each stage base. Wafer tables are held by the conveyance arm mechanisms of conveyance mechanisms, and are swapped between the two stage main bodies. In the exposure apparatus disclosed in this reference, vibration that can be generated by one stage main body is prevented from being transmitted to the other stage main body.

With the wafer table swapping scheme disclosed in this reference, in addition to wafer or wafer table positioning mechanisms, to swap the two wafer tables, the conveyance mechanisms that drive the two wafer tables two-dimensionally are indispensable. The conveyance mechanisms do not share components with the wafer or wafer table positioning mechanisms, but are completely independent, making the structure of the exposure apparatus complicated.

The conveyance mechanisms for swapping the wafer tables disclosed in Japanese Patent Laid Open No. 2001-203140 cannot swap the positions of the two conveyance arm mechanisms that respectively hold the wafer tables. Therefore, while the two conveyance arm mechanisms respectively hold the wafer tables, the two wafer tables cannot be simultaneously swapped between the two stage main bodies. Accordingly, the conveyance mechanisms for swapping the wafer tables disclosed in this reference require a long period of time for swapping the wafer tables.

SUMMARY OF THE INVENTION

The present invention has been made in view of the above background, and has as its object to provide a technique that can easily simplify the apparatus structure while enabling positioning of, e.g., two moving elements independently of each other at high speed and high accuracy.

According to the present invention, there is provided a positioning apparatus comprising first and second bases, and two moving elements which are guided by the first and second bases to move on the first and second bases, wherein a distance is ensured between the first and second bases, and when the two moving elements move between the first and second bases, both of a guide surface of the first base and a guide surface of the second base are used.

According to a preferred embodiment of the present invention, preferably, the apparatus further comprises a base driving mechanism which changes the distance between the first and second bases, wherein the base driving mechanism ensures a predetermined distance between the first and second bases when one of the two moving elements moves on the first base and the other one of the two moving elements moves on the second base, and moves the first and second bases close to each other, when the two moving elements move between the first and second bases, such that the distance between the first and second bases is less than the predetermined distance.

According to a preferred embodiment of the present invention, preferably, when the one moving element moves from the first base onto the second base, the other moving element moves from the second base onto the first base simultaneously.

According to another preferred embodiment of the present invention, the moving elements are moved by, e.g., an electromagnetic force that acts between the bases and moving elements. Furthermore, the moving elements can be moved between the first and second bases by an electromagnetic force that acts between the first and second bases and the moving elements.

According to still another preferred embodiment of the present invention, the positioning apparatus can further comprise a first driving mechanism which is connected to one of the two moving elements on the first base to move the one moving element, and a second driving mechanism which is connected to the other moving element on the second base to move the remaining moving element, and the two moving elements are driven by the first and second driving mechanisms to move on and between the first and second bases.

According to still another preferred embodiment of the present invention, the moving elements can be supported on the first and second bases by an air bearing. When the moving elements move between the first and second bases, preferably, a pneumatic pressure of the air bearing is increased to be higher than that in a case wherein the moving elements move on the first and second bases.

According to still another preferred embodiment of the present invention, the positioning apparatus can comprise a sensor which detects a relative positional relationship between the first and second bases, and the base driving mechanism can be driven on the basis of an output from the sensor.

According to still another preferred embodiment of the present invention, preferably, end portions of the guide surfaces of the first and second bases, which oppose each other, are chamfered.

According to still another preferred embodiment of the present invention, the first and second bases can respectively have engaging portions, and when the first and second bases are driven by the base driving mechanism to become close to each other, the engaging portion of the first base engages with the engaging portion of the second base to position the first and second bases with respect to each other.

An exposure apparatus according to the present invention is directed to an exposure apparatus which exposes a substrate coated with a photosensitive agent. The exposure apparatus comprises a positioning apparatus which has first and second stages and holds and positions substrates on the first and second stages, and a pattern forming portion which exposes the photosensitive agent on the substrate held on, of the first and second stages, a stage which is located in an exposure area, to form a latent pattern, wherein the positioning apparatus comprises a positioning apparatus according to the present invention, and the first and second moving elements respectively include the first and second stages.

A device manufacturing method according to the present invention comprises a step of forming a latent pattern on a photosensitive agent applied to a substrate by using an exposure apparatus according to the present invention, and a step of developing the latent pattern.

According to the present invention, a technique can be provided which facilitates simplification of the apparatus structure while enabling positioning of, e.g., two moving elements independently of each other at high speed and high accuracy.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIGS. 11A to 11F are views showing a stage swapping procedure;

DETAILED DESCRIPTION OF THE PREFERRED EMBODIMENTS

The preferred embodiments of the present invention will be described with reference to the accompanying drawings.

First Embodiment

Figure 1:
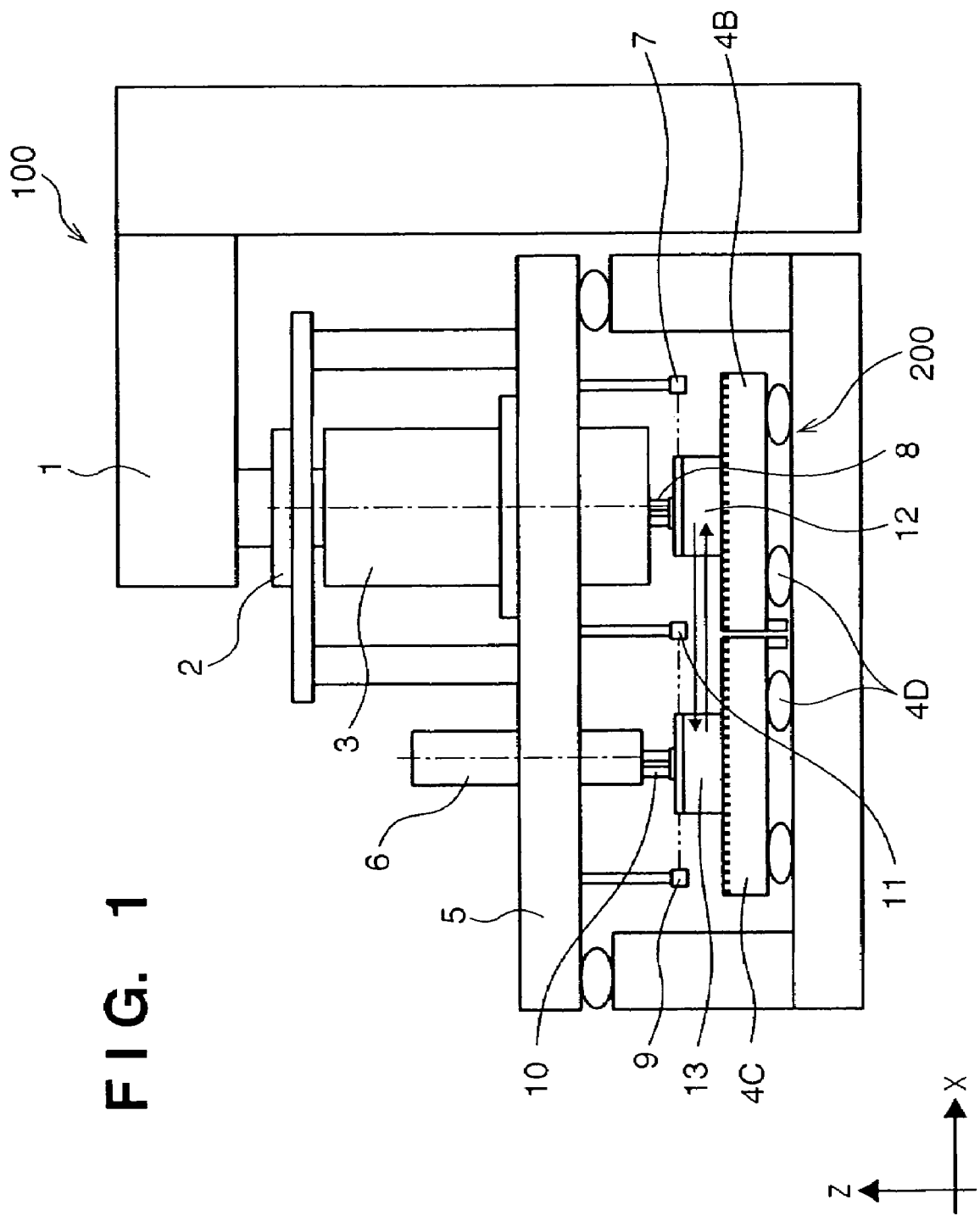
FIG. 1 is a side view showing the schematic structure of an exposure apparatus according to a preferred embodiment of the present invention.
Figure 2:
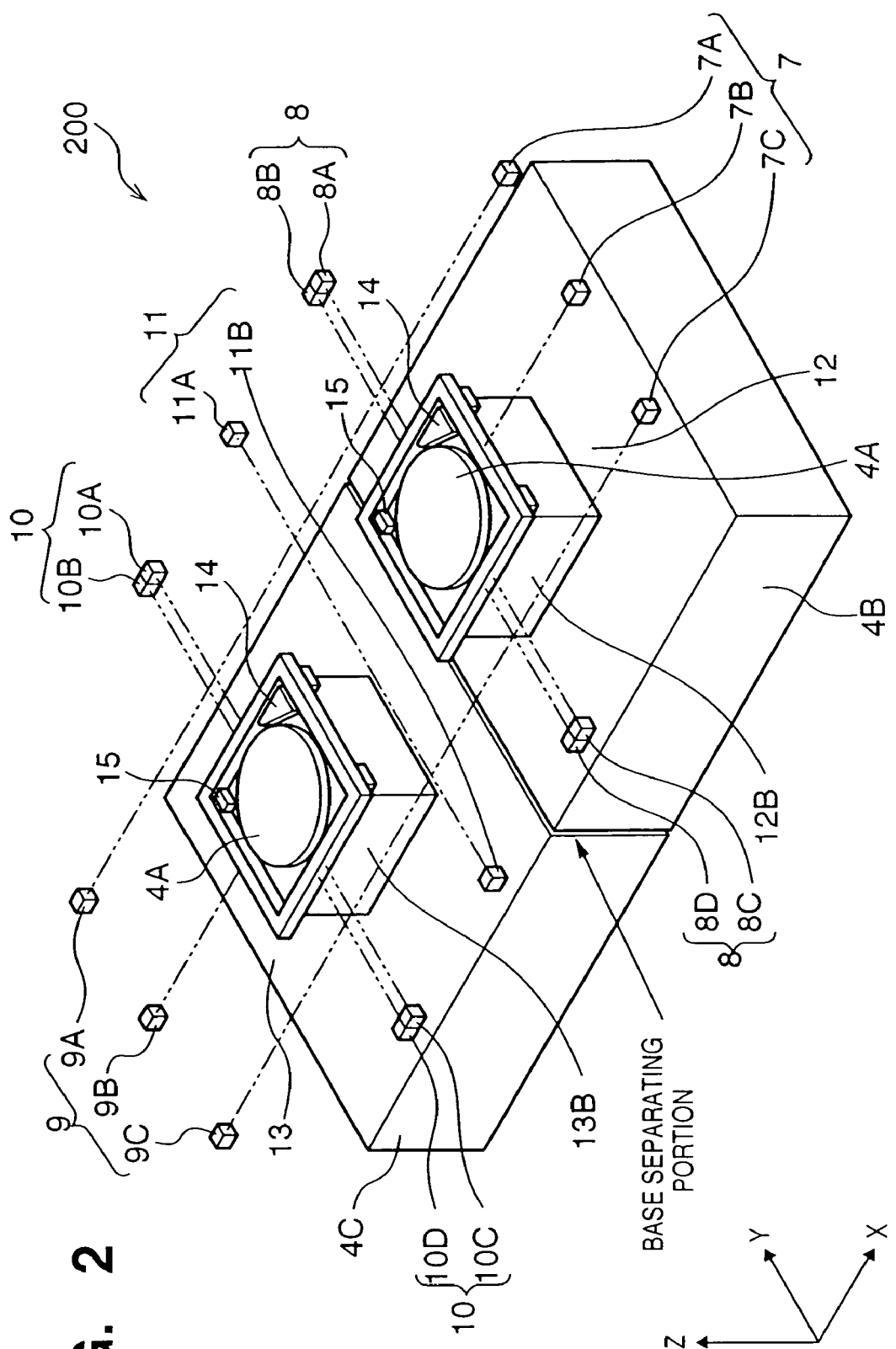
FIG. 2 is a perspective view showing the schematic structure of a positioning apparatus according to the preferred embodiment of the present invention, which is to be built into the exposure apparatus shown in FIG. 1.

FIG. 1 is a side view showing the schematic structure of an exposure apparatus according to a preferred embodiment of the present invention, and FIG. 2 is a perspective view showing the schematic structure of a positioning apparatus according to the preferred embodiment of the present invention, which is to be built into the exposure apparatus shown in FIG. 1. A positioning apparatus 200 has first and second stages 12 and 13, which respectively hold and move wafers (substrates). An exposure apparatus 100 into which the positioning apparatus 200 is built has an exposure process area 96 (see FIG. 5) where an exposure process (a process of forming a latent pattern on a photosensitive agent coated on a wafer) is performed, an alignment process area 95 (see FIG. 5) where an alignment process (a process of detecting a mark position, or the like, on the wafer for alignment) is performed, and a swap area 16 (see FIG. 5) where a stage present in the exposure process area and a stage present in the alignment process area are swapped. Part of the swap area can typically overlap part of the exposure process area and part of the alignment process area.

In the exposure apparatus 100, while an exposure process takes place in the exposure process area, an alignment process for a wafer, which is to be exposed next, takes place in the alignment process area. When the alignment process and exposure process are ended, the stage present in the exposure process area and the stage present in the alignment process area are swapped through the swap area. An aligned wafer is thus placed in the exposure process area and positioned on the basis of information (information for aligning a pattern with each shot area of the wafer) obtained by the alignment process, and a latent pattern is formed on each shot area. An exposed wafer is recovered by a conveyance mechanism, such as a robot hand in the exposure process area, alignment process area, swap area, or another area.

A reticle (original) is held by a reticle stage (original stage) 2 and illuminated by an illumination unit 1. The pattern of the reticle is projected onto a wafer (substrate) 4A on the stage 12 or 13 (the stage 12 in the case of FIG. 1) in the exposure process area through a reduction projection lens 3 to form a latent pattern on the photosensitive agent on the wafer 4A. The exposure apparatus 100 can employ a step and repeat scheme, a step and scan scheme, or another scheme. When the exposure apparatus 100 employs the step and scan scheme, while scanning the reticle by the reticle stage 2 and the stage that holds the wafer, the reticle pattern is transferred onto the wafer with a slit beam. The reticle and wafer are scanned with a speed ratio that matches the reduction ratio of the reduction projection lens 3.

The positioning apparatus 200 includes first and second separate stage bases (first and second bases) 4B and 4C as stage bases that support the first and second stages (first and second moving elements) 12 and 13. When driving the first and second stages 12 and 13 independently of each other (that is, when performing an exposure process and an alignment process simultaneously), the first and second stage bases 4B and 4C are arranged to be separate from each other by a predetermined distance. When swapping the positions of the first and second stages 12 and 13, the first and second stage bases 4B and 4C are moved to become close to each other such that a distance between them is less than the predetermined distance, and typically, brought into contact with each other. In performing the exposure process and alignment process simultaneously, if the first and second stage bases 4B and 4C are arranged to be separate from each other by the predetermined distance, when the first and second stages 12 and 13 are to be driven independently of each other, a reaction force generated by driving one stage can be prevented from adversely affecting (causing vibration, positioning error, or the like) the other stage.

Each of the first and second stage bases 4B and 4C is supported by mounts 4D. The mounts 4D typically include active mounts. The active mounts include stage base driving mechanisms which drive the stage bases. Each stage base driving mechanism is controlled to decrease the vibration on the basis of an output from a sensor, e.g., a vibration sensor, provided to the stage base, or the like. The stage base driving mechanism can also be used to change the distance between the first and second stage bases 4B and 4C, as will be described later.

The reticle stage 2, the reduction projection lens 3, an alignment scope 6, interferometers 7 to 11, and the like, can be supported by an intermediate base 5.

The alignment scope 6 includes a microscope which measures the position of an alignment mark formed on the wafer in the alignment process area and the position of a reference mark 14 provided to the stage (the stage 13 in the case of FIG. 1) that holds the wafer to obtain alignment information for positioning the wafer and aligning the wafer and reticle.

The X interferometers 7 (7A to 7C) measure the X direction position of the stage (the stage 12 in the case of FIG. 1) in the exposure process area. The Y interferometers 8 (8A to 8D) measure the Y direction position of the stage (the stage 12 in the case of FIG. 1) in the exposure process area.

The X interferometers 9 (9A to 9C) measure the X direction position of the stage (the stage 13 in the case of FIG. 1) in the alignment process area. The Y interferometers 10 (10A to 10D) measure the Y direction position of the stage (the stage 13 in the case of FIG. 1) in the alignment process area.

The Y interferometers 11 (11A and 11B) measure the Y direction positions of the stages 12 and 13 in the swap area.

An illuminance sensor 15 is arranged on the upper surface of each of the first and second stages 12 and 13 and can be used to measure the illuminance of the exposure light before exposure for the purpose of exposure amount correction (calibration).

Figure 3:
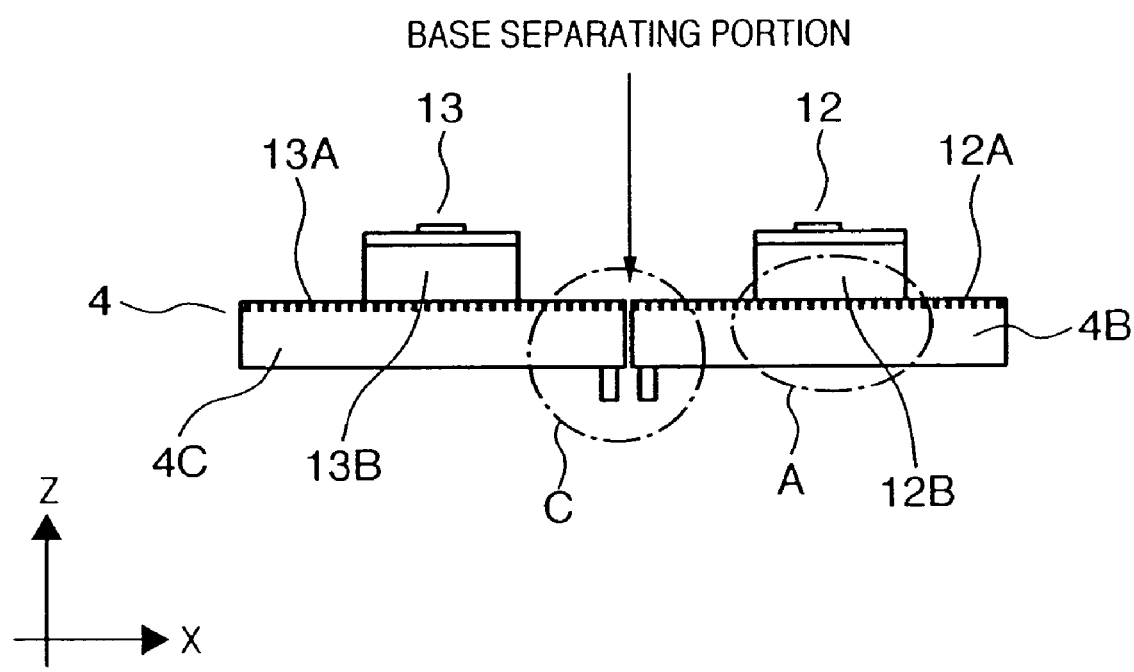
FIG. 3 is a sectional view schematically showing the structure of a planar motor.

An example of the structure of the positioning apparatus 200 will be described with reference to FIGS. 3 to 7. As shown in FIG. 3, the first stage 12 is mounted on a first slider 12B, and the second stage 13 is mounted on a second slider 13B. In this embodiment, the first stage 12 and slider 12B form a first moving element, and the second stage 13 and slider 13B form a second moving element.

Figure 4:
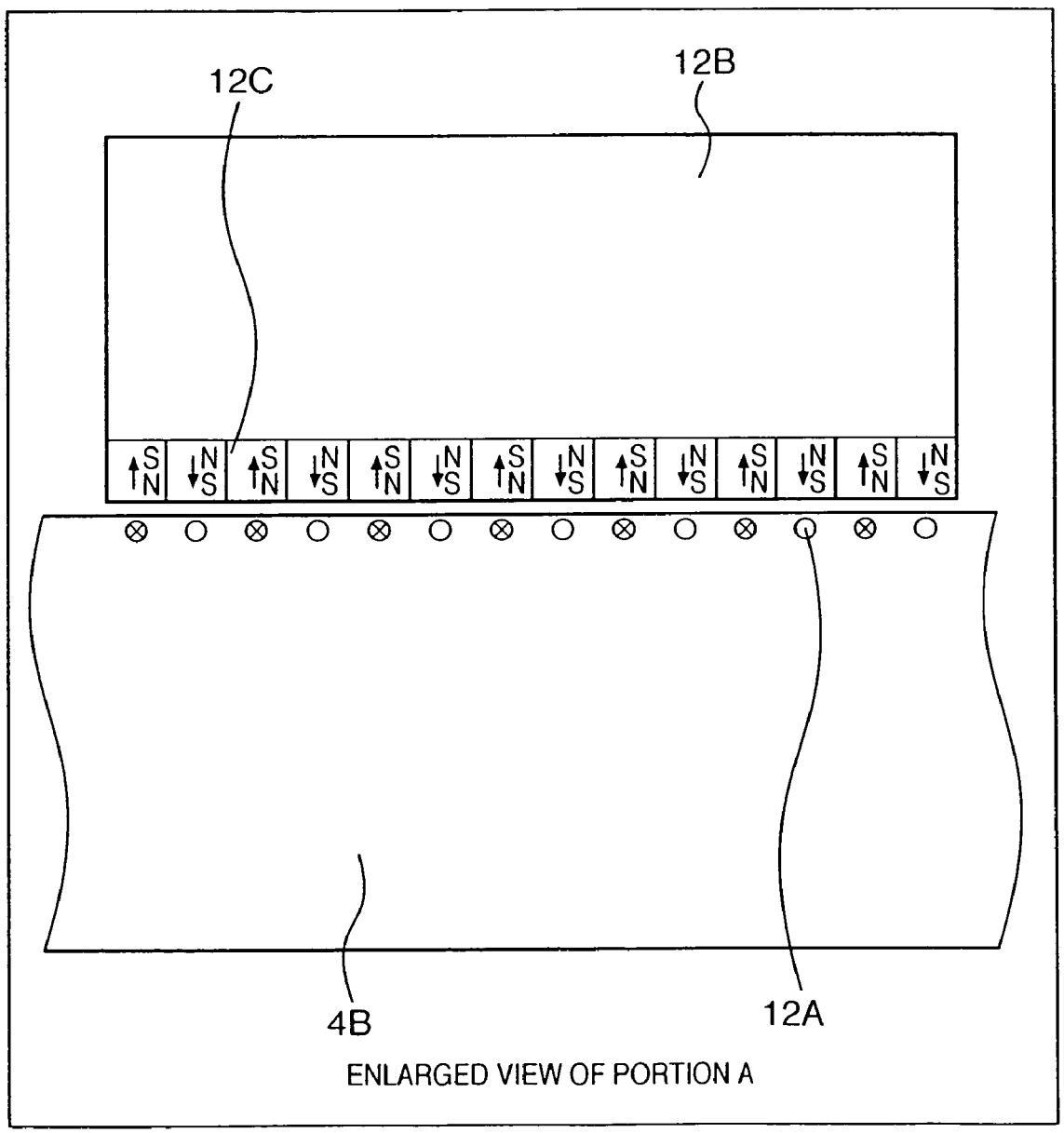
FIG. 4 is an enlarged view of a portion A of FIG. 3.

FIG. 4 is an enlarged view of a portion A of FIG. 3. The first stage base 4B has a coil (planar motor coil) 12A which forms a planar motor. The planar motor coil 12A is arranged to cover the moving range of the first slider 12B within the exposure process area. The first slider 12B has a magnet (planar motor magnet) 12C which forms a planar motor. When a driving current is applied to the planar motor coil 12A, the Lorentz force (electromagnetic force) is exerted on the planar motor magnet 12C to move the first slider 12B in an X-Y plane.

Similarly, the second stage 13 has a planar motor coil 13A, and the second slider 13B has a planar motor magnet. When a driving current is applied to the planar motor coil 13A of the second stage 13, the Lorentz force (electromagnetic force) is exerted on the planar motor magnet of the second slider 13B to move the second slider 13B in the X-Y plane.

An air bearing (not shown) is arranged between the first and second sliders 12B and 13B and the first and second stage bases 4B and 4C. The first and second sliders 12B and 13B are levitated with respect to the guide surfaces of the first and second stage bases 4B and 4C and move in noncontact with them.

Figure 6:
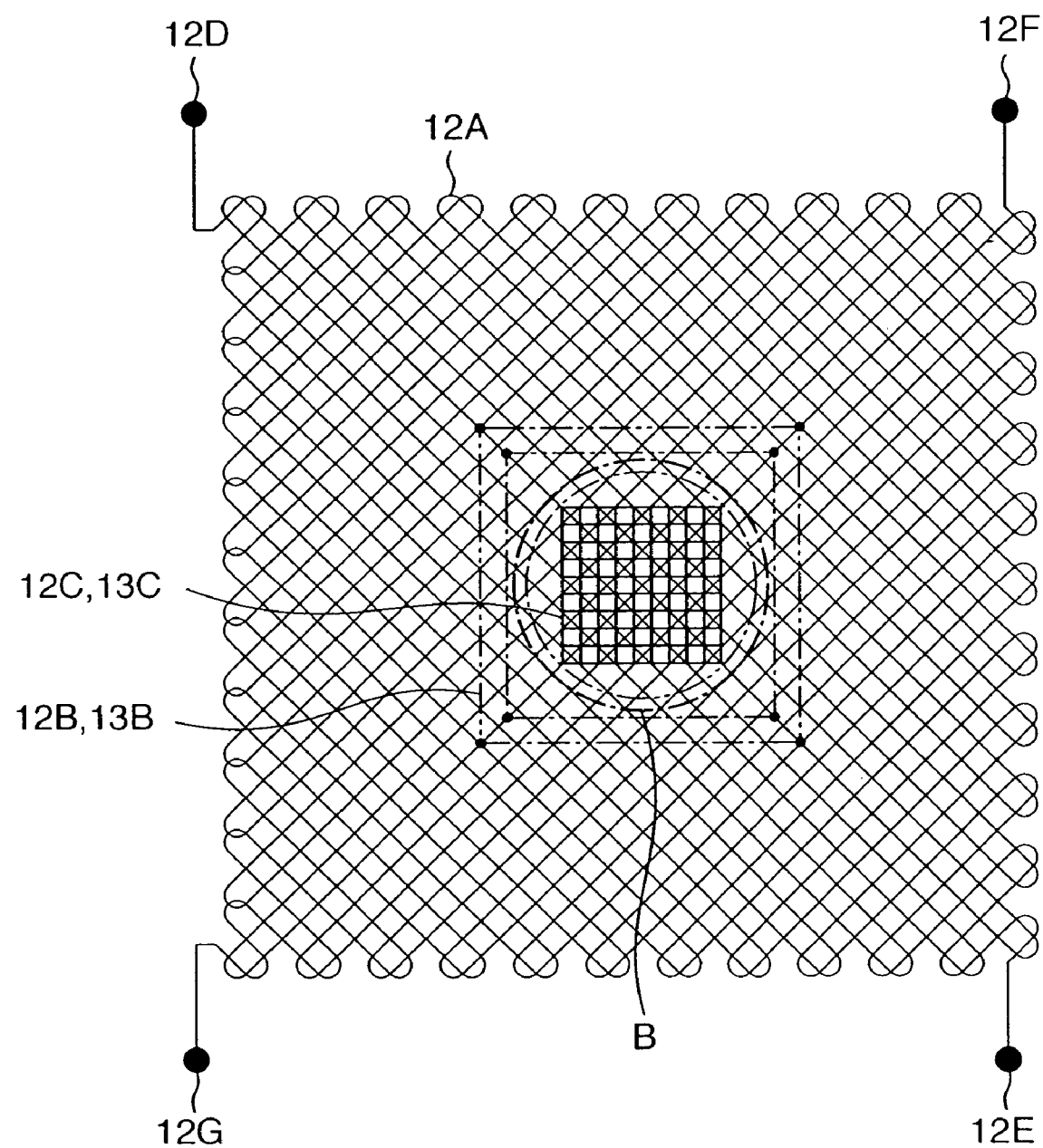
FIG. 6 is a view showing the structure of a planar motor coil.
Figure 7:
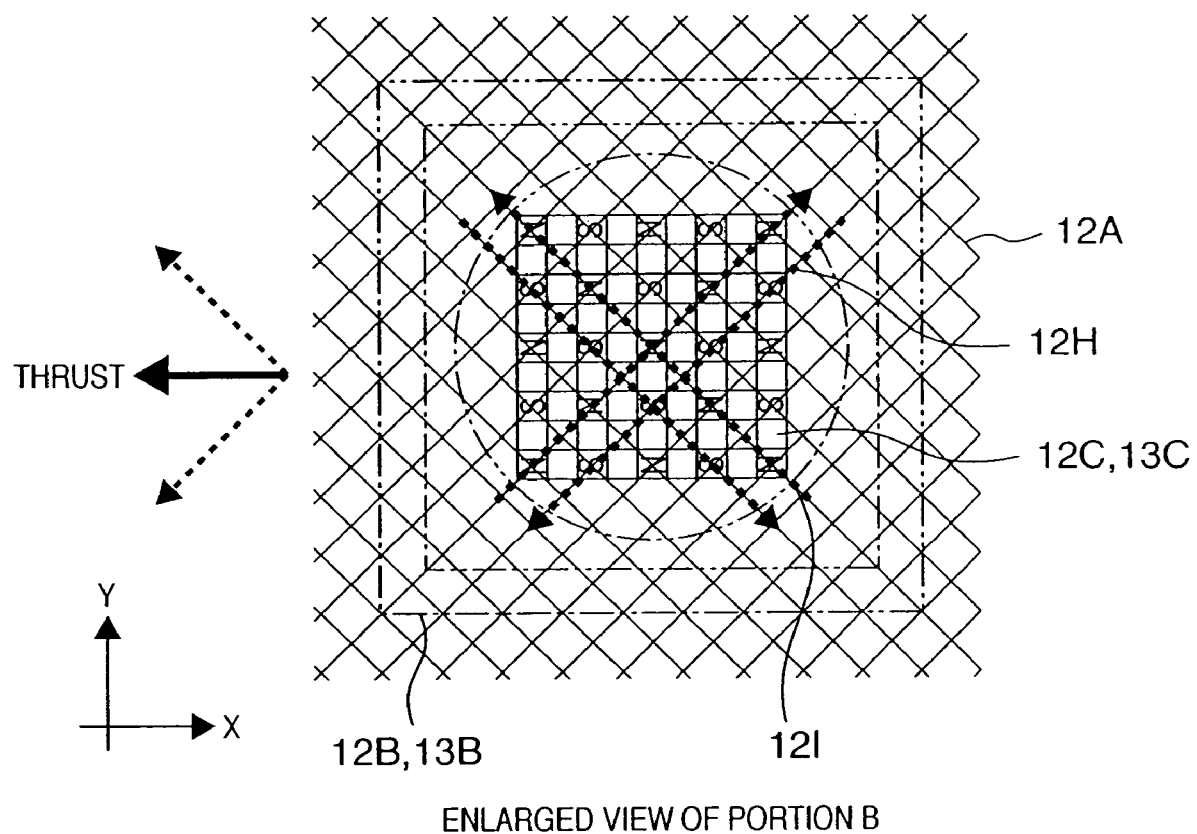
FIG. 7 is a view showing the structure of the planar motor coil.

As shown in FIGS. 6 and 7, the planar motor coil 12A includes first and second single-wire coils perpendicular to each other. Each single-wire coil is turned back at the peripheral portion of the area where it is arranged and runs parallel to its pre-turn portion. The first coil has coil terminals 12D and 12E, and the second coil has coil terminals 12F and 12G. The planar motor coil 13A also has the same structure as that of the planar motor coil 12A.

The principle of the planar motor will be described. As shown in FIG. 7, when driving currents 12H and 12I are applied to the planar motor coil 12A in directions indicated by arrows, the Lorentz forces (electromagnetic forces) act in two directions on the planar coil magnet of the first slider 12B (or second slider 13B) due to the magnetic fields generated by the two perpendicular coils, and the resultant force drives the first slider 12B (or second slider 13B) in a −X direction. Based on this principle, when the directions of the driving currents to be applied to the two coils that form the planar motor coil are changed, the slider can be driven in the X and Y directions.

Figure 5:
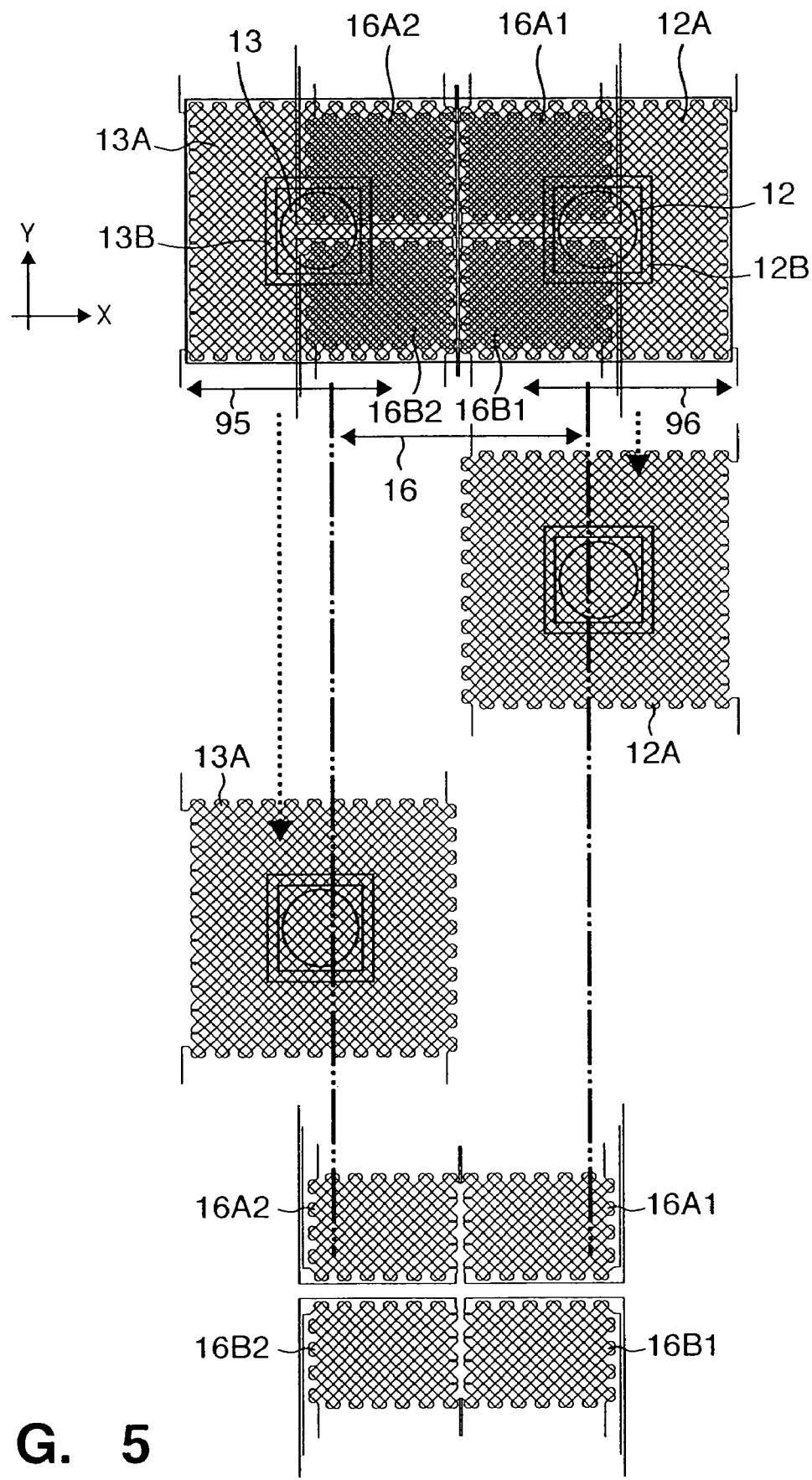
FIG. 5 is a view showing the layout of planar motor coils.

As shown in FIG. 5, the first stage base 4B (of FIG. 4) has, in addition to the simultaneous processing (or independent driving) planar motor coils which drive the stage (the stage 12 in the case of FIG. 5) in the exposure process and alignment process, and swapping planar motor coils 16A1 and 16B1 which drive the stages during swapping. Similarly, the first stage base 4B has, in addition to the simultaneous processing (or independent driving) planar motor coils which drive the stage (the stage 13 in the case of FIG. 5) in the exposure process and alignment process, and swapping planar motor coils 16A2 and 16B2 which drive the stages during swapping.

The swapping planar motor coils 16A1 and 16B1 overlap the area where the simultaneous processing planar motor coil 12A is arranged, so that the area where the stage can be driven by the simultaneous processing planar motor coil 12A overlaps the area where the stage can be driven by the swapping planar motors coil 16A1 and 16B1. Similarly, the swapping planar motor coils 16A2 and 16B2 overlap the area where the simultaneous processing planar motor coil 13A is arranged, so that the area where the stage can be driven by the simultaneous processing planar motor coil 13A overlaps the area where the stage can be driven by the swapping planar motor coils 16A2 and 16B2. With this structure, the stages 12 and 13, which are driven by the simultaneous processing planar motor coils 12A and 13A in the exposure process and alignment process, which are to be performed simultaneously, can be swapped by the swapping planar motor coils 16A1, 16A2, 16B1, and 16B2.

Figure 8:
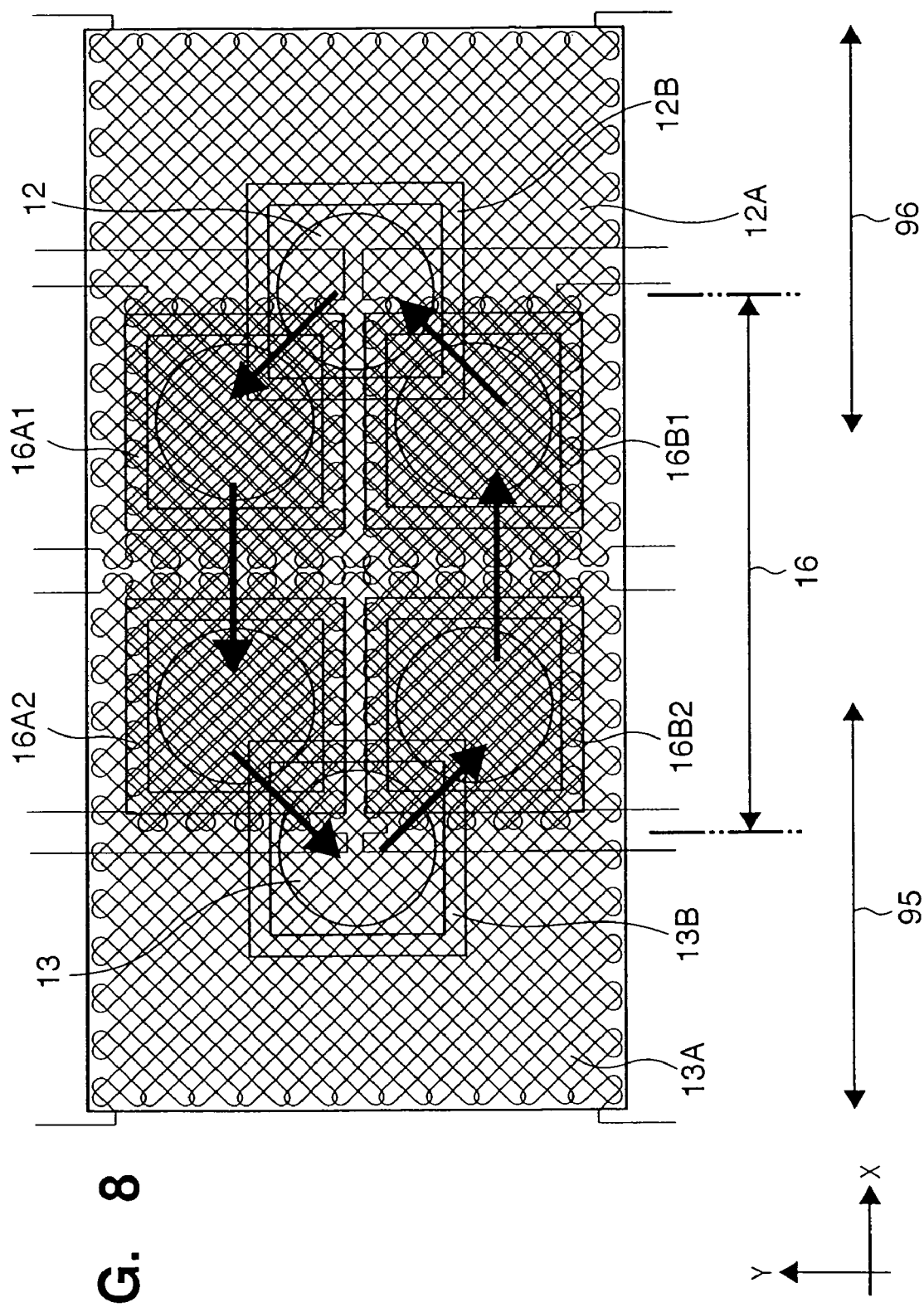
FIG. 8 is a view for explaining a stage swapping operation.

As shown in FIG. 8, in the swap area 16, in order to swap the position of the first slider 12B on which the first stage 12 is mounted and the position of the second slider 13B on which the second stage 13 is mounted, the first and second sliders 12B and 13B are temporarily positioned in the swap area 16, as indicated by arrows. After that, the swapping planar motor coils 16A1, 16A2, 16B1, and 16B2 are driven to swap the positions of the first and second sliders 12B and 13B.

Figure 9:
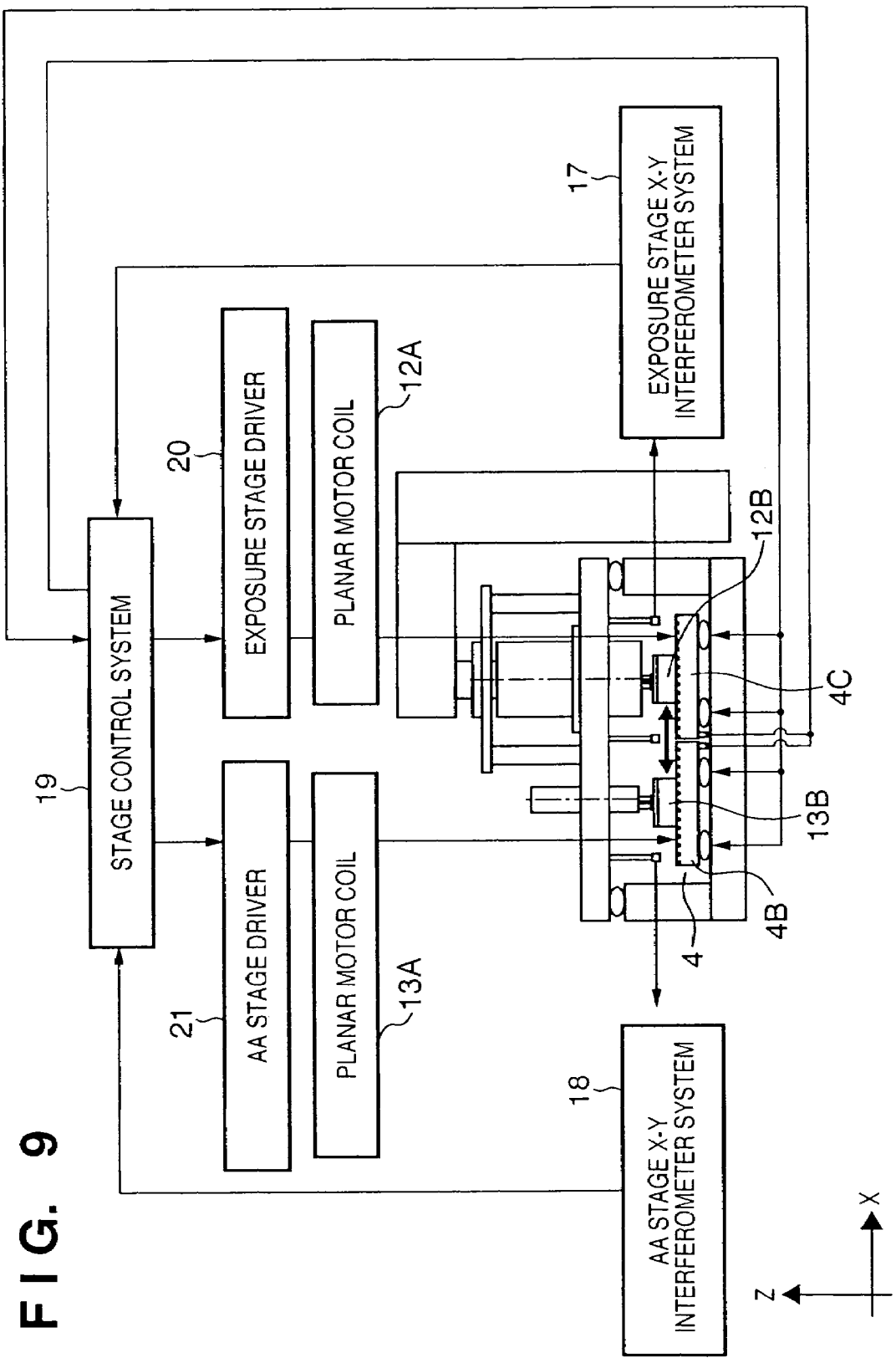
FIG. 9 is a block diagram showing an example of the structure of a control system for the positioning apparatus.
Figure 10:
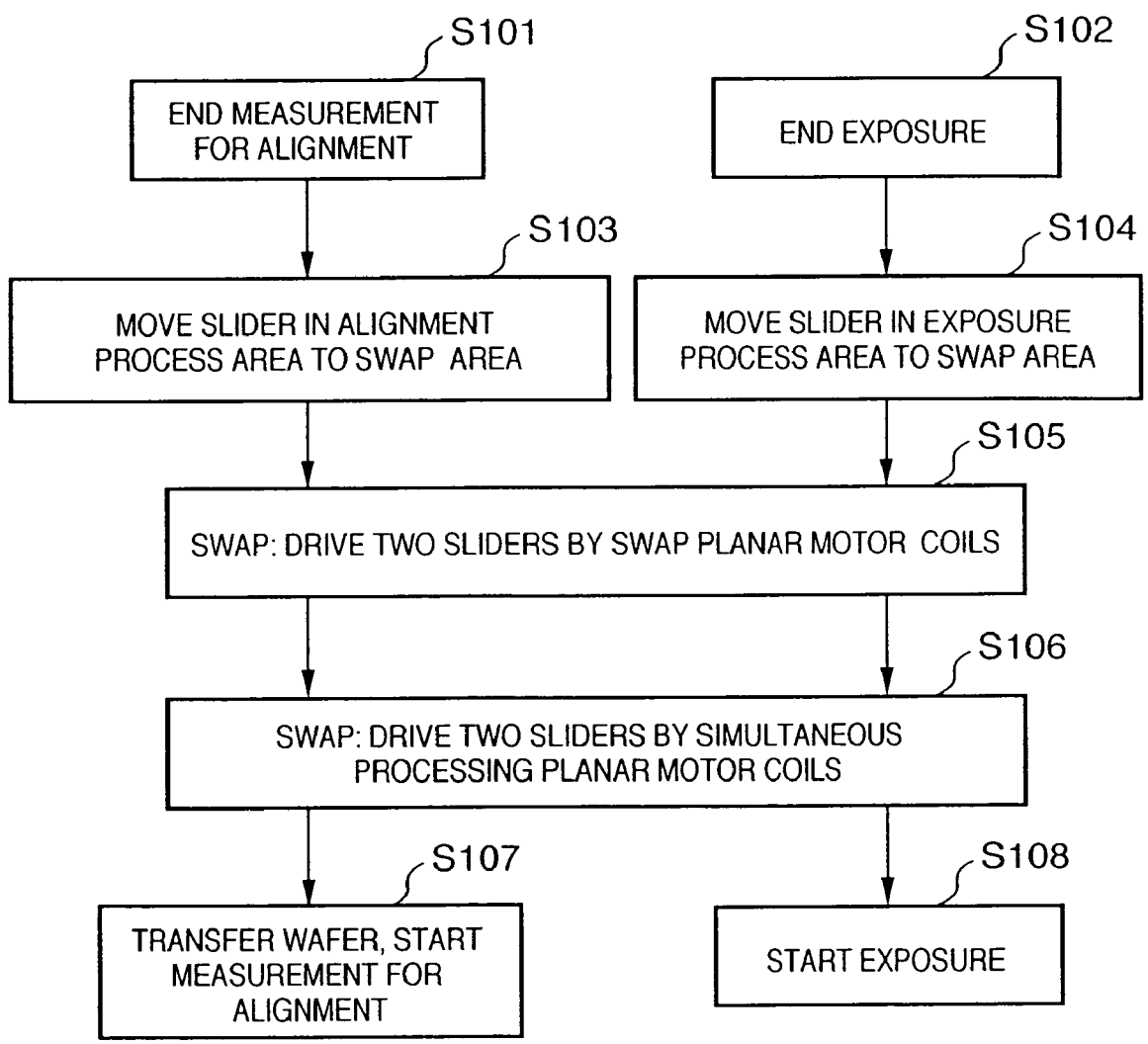
FIG. 10 is a flowchart for explaining the stage swapping operation of the exposure apparatus.

FIG. 9 is a view showing an example of the structure of a control system for the positioning apparatus 200. An exposure stage X-Y interferometer system 17 measures the position in the X-Y plane of the stage (the stage 12 in the case of FIG. 9) located in the exposure process area 96 by using the X and Y interferometers 7 and 8 described above. The measurement result is provided to a stage control system 19.

An alignment stage X-Y interferometer system 18 measures the position in the X-Y plane of the stage (the stage 13 in the case of FIG. 9) located in the alignment process area 95 by using the X interferometers 9 and Y interferometers 10 described above, and provides the measurement result to the stage control system 19.

The stage control system 19 controls positioning of the stages 12 and 13 on the basis of the position information on the stages 12 and 13 provided from the interferometer systems 17 and 18, and alignment between the stage and the reticle stage 2 in the exposure process area 96.

An exposure stage driver 20 determines the driving current and the target position of the stage in the exposure process area 96 in response to an instruction provided from the stage control system 19, and applies the driving current to the planar motor coil 12A. An alignment stage driver 21 determines the driving current and the target position of the stage in the alignment process area 95 in response to an instruction provided from the stage control system 19, and applies the driving current to the planar motor coil 13A.

The stage swapping operation of the exposure apparatus 100 will be described with reference to FIG. 10 and FIGS. 11A to 11F.

In step 101, an alignment process for the wafer in the alignment process area is ended. In step 102, an exposure process for the wafer in the exposure process area is ended.

In step 103, the slider 13B, on which the stage 13 is mounted, in the alignment process area, is moved from the position (the position in the alignment process area) shown in the FIG. 11A to the position (the position in the swap area) shown in FIG. 11C via the position shown in FIG. 11B by applying the driving current to the planar motor coil 13A. Simultaneously with step 103, in step 104, the slider 12B, on which the stage 12 is mounted, in the exposure process area, is moved from the position (the position in the exposure process area) shown in FIG. 11A to the position (the position in the swap area) shown in FIG. 11C via the position shown in FIG. 11B by applying the driving current to the planar motor coil 12A.

In step 105, the sliders 12B and 13B in the swap area 16 are moved from the positions (the positions in the swap area) shown in FIG. 11C to the positions (the positions in the swap area) shown in FIG. 11D by applying the driving currents to the swapping planar motor coils 16A1, 16A2, 16B1, and 16B2.

In step 106, the sliders 13B and 12B are driven from the positions shown in FIG. 11D to the positions shown in FIG. 11F via the positions shown in FIG. 11E by the simultaneous processing planar motor coils 12A and 13A. With the above operation, the positions of the sliders 12B and 13B are swapped.

In step 107, in the alignment process area, the wafer (exposed wafer) on the stage 12 mounted on the slider 12B and a new wafer are swapped by conveyance mechanisms (not shown), and an alignment process for the new wafer is started. Simultaneously with step 107, in step 108, in the exposure process area, an exposure process (transfer of the reticle pattern) is started for the wafer (the wafer for which the alignment process (measurement for alignment) has been completed) on the stage 13 mounted on the slider 13B.

When the above operation is repeated, a plurality of wafers are continuously processed while the alignment process and exposure process are performed simultaneously in each cycle.

In the series of operations described above, the interferometers for position measurement in the X-Y direction of the slider (stage) are switched in the following manner. In the layout shown in FIG. 11A, the X-direction position of the slider 12B is measured by the X interferometer 7B, and its Y-direction position and rotation angle about a Z-axis are measured by the Y interferometers 8A and 8B. The X-direction position of the slider 13B is measured by the X interferometer 9B, and its Y-direction position and rotation angle about the Z-axis are measured by the Y interferometers 10C and 10D.

In the layout shown in FIG. 11B, the X direction position of the slider 12B is measured by the X interferometers 7A and 7B, and its Y-direction position and rotation angle about the Z-axis are measured by the Y interferometers 8A and 8B. The X-direction position of the slider 13B is measured by the X interferometers 9B and 9C, and its Y-direction position and rotation angle about the Z-axis are measured by the Y interferometers 10C and 10D.

In the layout shown in FIG. 11C, the X direction position of the slider 12B is measured by the X interferometer 7A, and its Y-direction position and rotation angle about the Z-axis are measured by the Y interferometers 8B and 11A. The X-direction position of the slider 13B is measured by the X interferometer 9C, and its Y-direction position and rotation angle about the Z-axis are measured by the Y interferometers 10C and 11B.

In the layout shown in FIG. 11D, the X direction position of the slider 12B is measured by the X interferometer 7A, and its Y-direction position and rotation angle about the Z-axis are measured by the Y interferometers 10A and 11A. The X-direction position of the slider 13B is measured by the X interferometer 9C, and its Y-direction position and rotation angle about the Z-axis are measured by the Y interferometers 8D and 11B.

In the layout shown in FIG. 11E, the X-direction position of the slider 12B is measured by the X interferometers 9A and 9B, and its Y-direction position and rotation angle about the Z-axis are measured by the Y interferometers 10A and 10B. The X-direction position of the slider 13B is measured by the X interferometers 7B and 7C, and its Y direction position and rotation angle about the Z-axis are measured by the Y interferometers 8C and 8D.

In the layout shown in FIG. 11F, the X direction position of the slider 12B is measured by the X interferometer 9B, and its Y direction position and rotation angle about the Z-axis are measured by the Y interferometers 10A and 10B. The X-direction position of the slider 13B is measured by the X interferometer 7B, and its Y-direction position and rotation angle about the Z-axis are measured by the Y interferometers 8C and 8D.

When the measuring interferometers are switched in the above manner such that the measurement results for the respective axes are not intermittent, the two stages can be swapped by the planar motors between the exposure process area and the alignment process area.

Figure 12A:
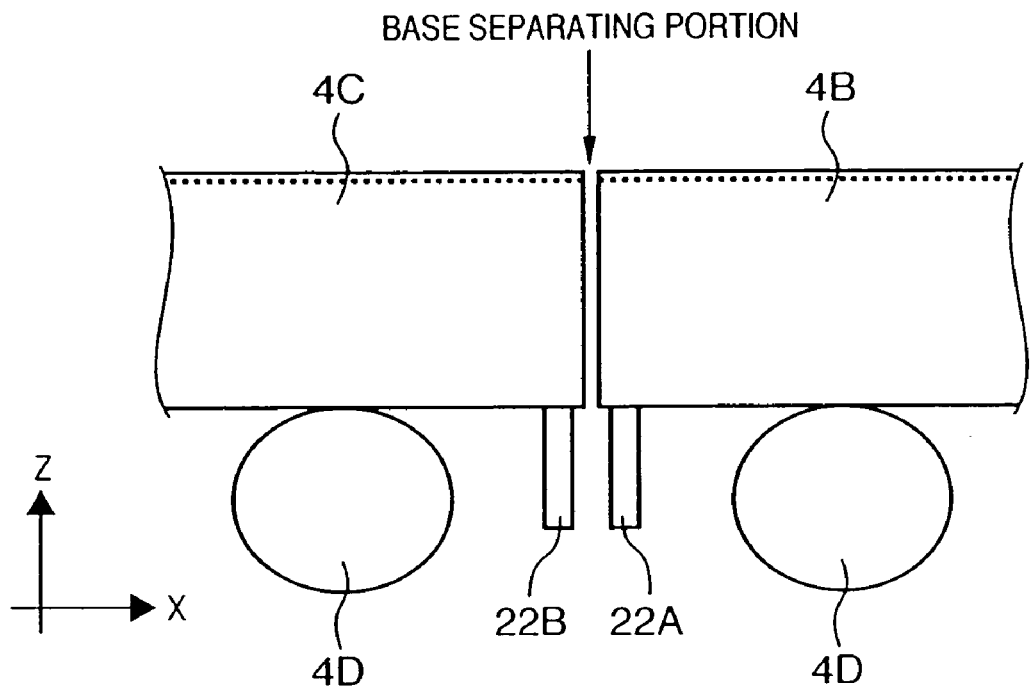
FIGS. 12A and 12B are enlarged views of a portion C of FIG. 3.
Figure 12B:
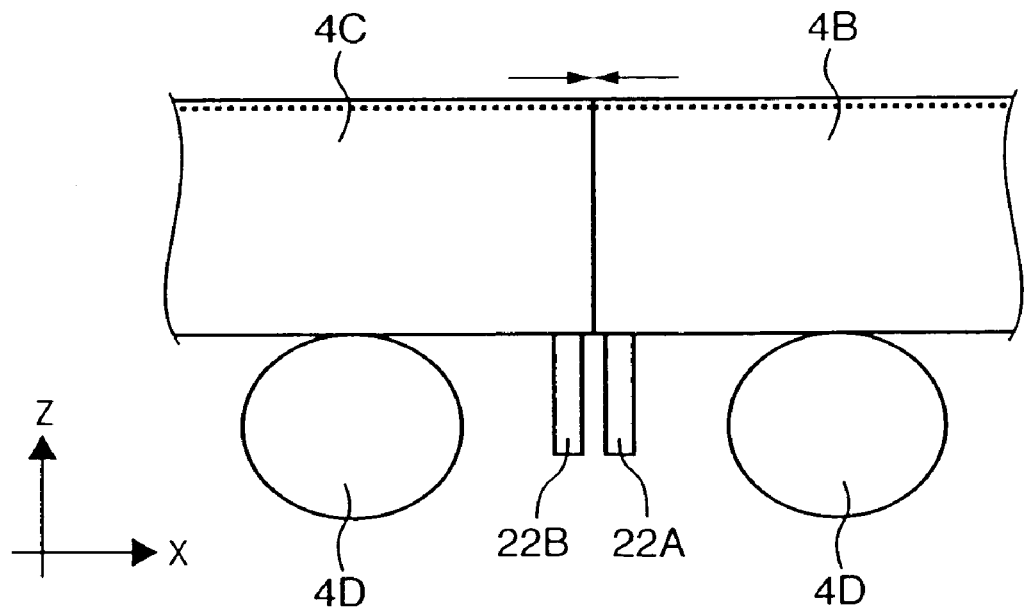

As described above, the stage base, which supports the first and second stages 12 and 13, is separated into the first and second stage bases 4B and 4C. FIGS. 12A and 12B are enlarged views of a portion C of FIG. 3. As shown in FIG. 12A, when the first and second stages 12 and 13 are to be driven independently of each other (that is, when an exposure process and an alignment process are to be performed simultaneously), the first and second stage bases 4B and 4C are arranged sufficiently separate from each other so they are not brought into contact with each other by reaction forces, which are generated when the sliders on which the stages are mounted, are driven. When the positions of the first and second stages 12 and 13 are to be swapped, the first and second stage bases 4B and 4C are moved close to each other, typically, into contact with each other. In performing the exposure process and alignment process simultaneously, if the first and second stage bases 4B and 4C are arranged to be separate from each other by the predetermined distance, when the first and second stages 12 and 13 are driven independently of each other, a reaction force, which is generated by driving one stage can be prevented from adversely affecting (transmission of vibration, increase in positioning error, increase in settling time, and the like) the other stage. The mutual positional relationship between the first and second stage bases 4B and 4C can be realized by driving the first stage base 4B and/or second stage base 4C by the mounts 4D, including the stage base driving mechanisms.

In the structure examples shown in FIGS. 12A and 12B, relative position sensors 22A and 22B, which detect the positions (e.g., in an X, Y, and Z directions) of the stage bases 4B and 4C relative to each other, are provided. In the stage control system 19 shown in FIG. 9, when the positions of the stages 12 and 13 are to be swapped, or when swapping is ended and an alignment process and exposure process are to be started, the driving mechanisms provided to the mounts 4D are controlled on the basis of outputs from the relative position sensors 22A and 22B to adjust the distance between the stage bases 4B and 4C.

According to this embodiment, the first and second stage bases 4B and 4C are positioned relative to each other by the mounts 4D on the basis of the measurement results of the relative position sensors 22A and 22B. Thus, when the stages 12 and 13 are to be swapped between the first and second stage bases 4B and 4C, they can be smoothly moved between the first and second stage bases 4B and 4C while the first and second sliders 12B and 13B, on which the stages 12 and 13 are respectively mounted, are supported by the air bearing.

When the stages 12 and 13 are to be swapped, the pneumatic pressure of the air bearing between the first and second sliders 12B and 13B and the first and second stage bases 4B and 4C is preferably increased to be higher than that in a case wherein the alignment process and exposure process are performed simultaneously (when swapping is not to be performed). Then, the levitating amount (the gap between the stage bases and sliders) of the sliders levitated by the air bearing can be increased. Even when the first or second stage base 4B or 4C is vibrated by a disturbance, or the like, the collision of the slider against the corner of the stage base can be prevented.

Second Embodiment

Figure 13A:
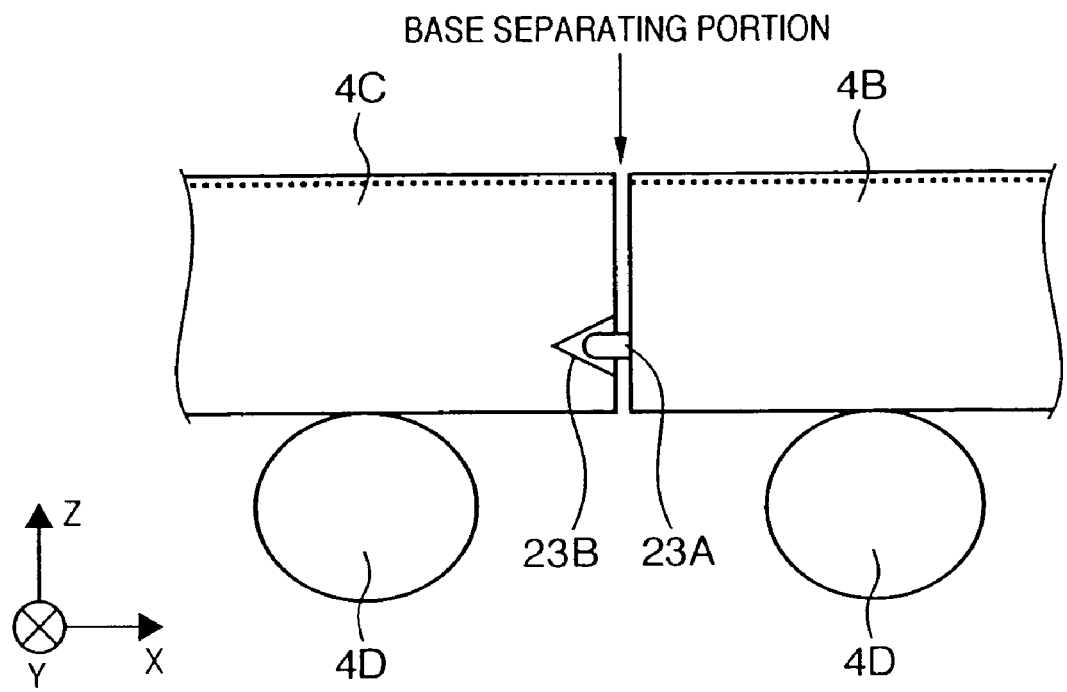
FIGS. 13A and 13B are enlarged views of the portion C of FIG. 3 in the second embodiment.
Figure 13B:
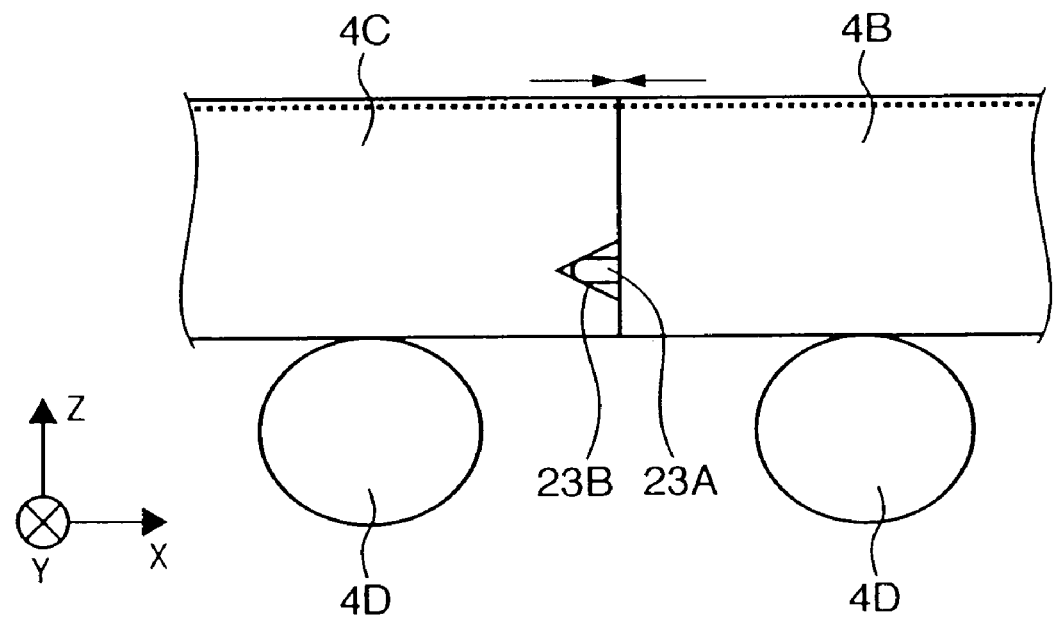

The second embodiment provides a modification of the first embodiment. Matters that are not particularly referred to herein can follow the first embodiment. FIGS. 13A and 13B are enlarged views of the portion C of FIG. 3.

A stage base, which supports first and second stages 12 and 13, is separated into first and second stage bases 4B and 4C, in the same manner as that in the first embodiment. When the first and second stages 12 and 13 are to be driven independently of each other (that is, when an exposure process and an alignment process are to be performed simultaneously), as shown in FIG. 13A, the first and second stage bases 4B and 4C are arranged sufficiently separate from each other so they are not brought into contact with each other by reaction forces, which are generated when the sliders on which the stages are mounted, are driven. When the positions of the first and second stages 12 and 13 are to be swapped, the first and second stage bases 4B and 4C are moved close to each other. In performing the exposure process and the alignment process simultaneously, if the first and second stage bases 4B and 4C are arranged to be separate from each other, when the first and second stages 12 and 13 are driven independently of each other, a reaction force, which is generated by driving one stage, can be prevented from adversely affecting the other stage. The mutual positional relationship between the first and second stage bases 4B and 4C can be realized by driving the first stage base 4B and/or second stage base 4C by the mounts 4D, including the stage base driving mechanisms.

According to this embodiment, the first and second stage bases 4B and 4C are respectively provided with engaging portions, which serve as mechanisms to position the first and second stage bases 4B and 4C with respect to each other. In the example shown in FIGS. 13A and 13B, the first stage base 4B has a positioning pin 23A as the engaging portion, and the second stage base 4C has a recess 23B as the engaging portion. When swapping the positions of the first and second stages 12 and 13, a stage control system 19 controls the driving mechanisms provided to mounts 4D to move the first and second stage bases 4B and 4C close to each other. Thus, the positioning pin 23A engages with the recess 23B, and the first and second stage bases 4B and 4C are positioned with respect to each other such that they establish a predetermined positional relationship in the X, Y, and Z directions. The predetermined positional relationship means, regarding the Z direction, that the guide surface (the surface which guides the slider) of the first stage base 4B and the guide surface of the second stage base 4C are leveled with each other, and regarding the X and Y directions, a positional relationship that allows the stages 12 and 13 to be swapped between the first and second stage bases 4B and 4C.

According to this embodiment, the first and second stage bases 4B and 4C are positioned with respect to each other by the engaging portions, such as the positioning pin 23A and recess 23B. When the stages 12 and 13 are to be swapped between the first and second stage bases 4B and 4C, they can be smoothly moved between the first and second stage bases 4B and 4C while the first and second sliders 12B and 13B, on which the stages 12 and 13 are respectively mounted, are supported by the air bearing.

Third Embodiment

Figure 14:
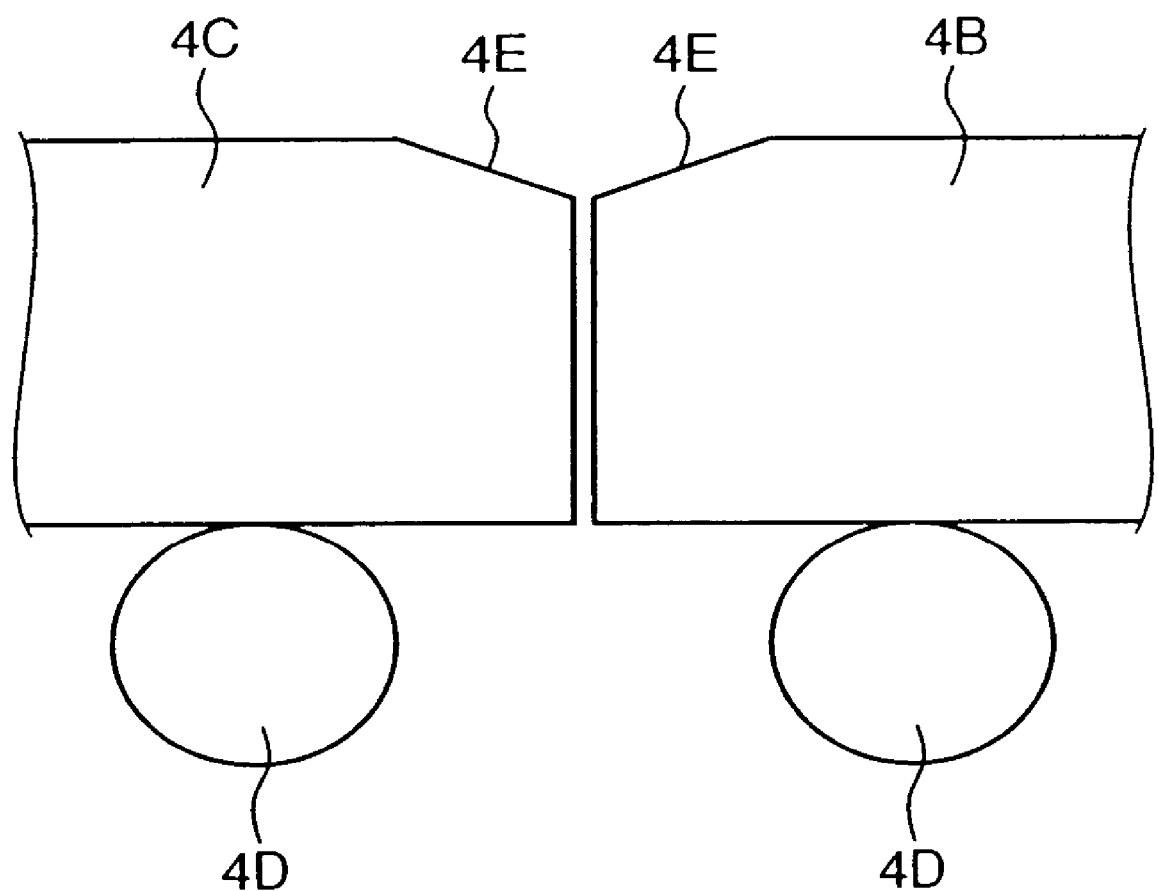
FIG. 14 is an enlarged view of the portion C of FIG. 3 in the third embodiment.

The third embodiment provides a modification of the first or second embodiment. Matters that are not particularly referred to herein can follow the first or second embodiment. FIG. 14 is an enlarged view of the portion C of FIG. 3.

According to this embodiment, chamfered portions 4E are formed on those ends of the guide surfaces of first and second stage bases 4B and 4C, which correspond to the opposing portions of the first and second stage bases 4B and 4C. The chamfered portions 4E may be flat surfaces as shown in FIG. 14, or may be smooth surfaces, such as curved structures. When the chamfered portions 4E are respectively formed on the first and second stage bases 4B and 4C, even if a positioning error exists between the first and second stage bases 4B and 4C, or the height difference between the first and second stage bases 4B and 4C exceeds the levitating amount (the gap between the stage bases and sliders) of the sliders produced by the air bearing, as in a case wherein the first and second stage bases 4B and 4C are vibrated by a disturbance, or the like, the sliders can be prevented from strongly colliding against the corners of the stage bases to damage the sliders and stage bases.

Fourth Embodiment

The fourth embodiment provides another driving scheme for the planar motors in the first to third embodiments. Matters that are not particularly referred to herein can follow the first to third embodiments.

Figure 15:
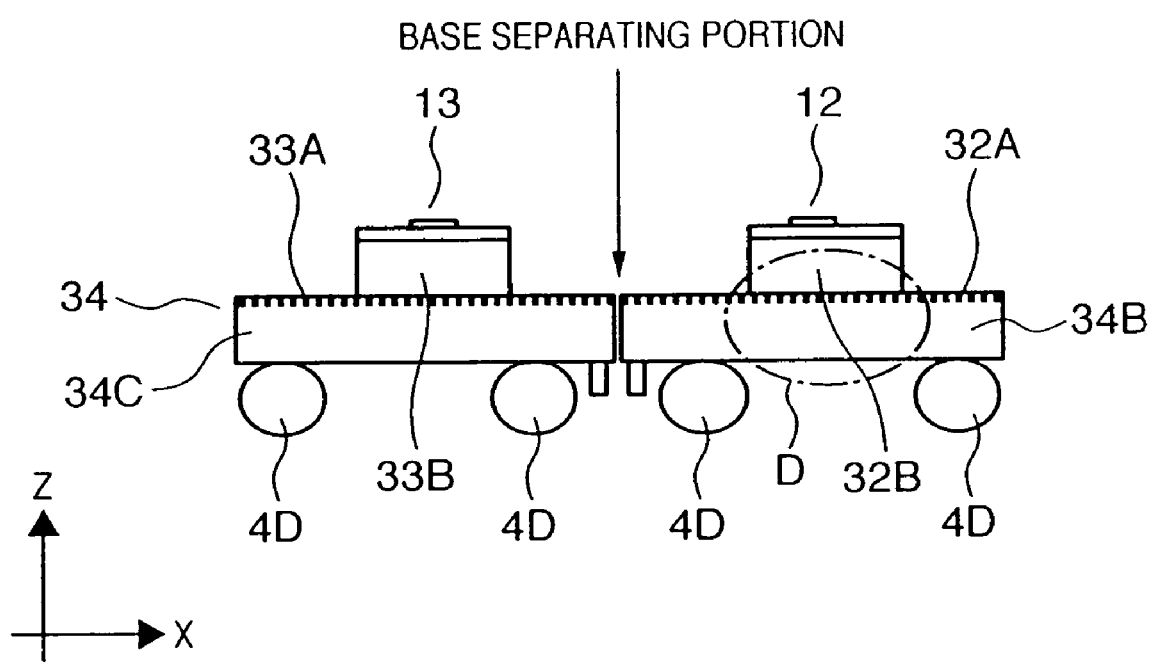
FIG. 15 is a view schematically showing the structure of a positioning apparatus according to the fourth embodiment.

This embodiment provides an application to a Sawyer scheme planar pulse motor, which is also useful, just like the Lorentz driving scheme in the first to third embodiments. As shown in FIG. 15, the first and second sliders 12B and 13B of the first to third embodiments are replaced by first and second planar pulse motor sliders 32B and 33B, and the first and second stage bases 4B and 4C of the first to third embodiments are replaced by first and second stage bases 34B and 34C, respectively having first and second planar pulse motor platens 32A and 33A.

Figure 16:
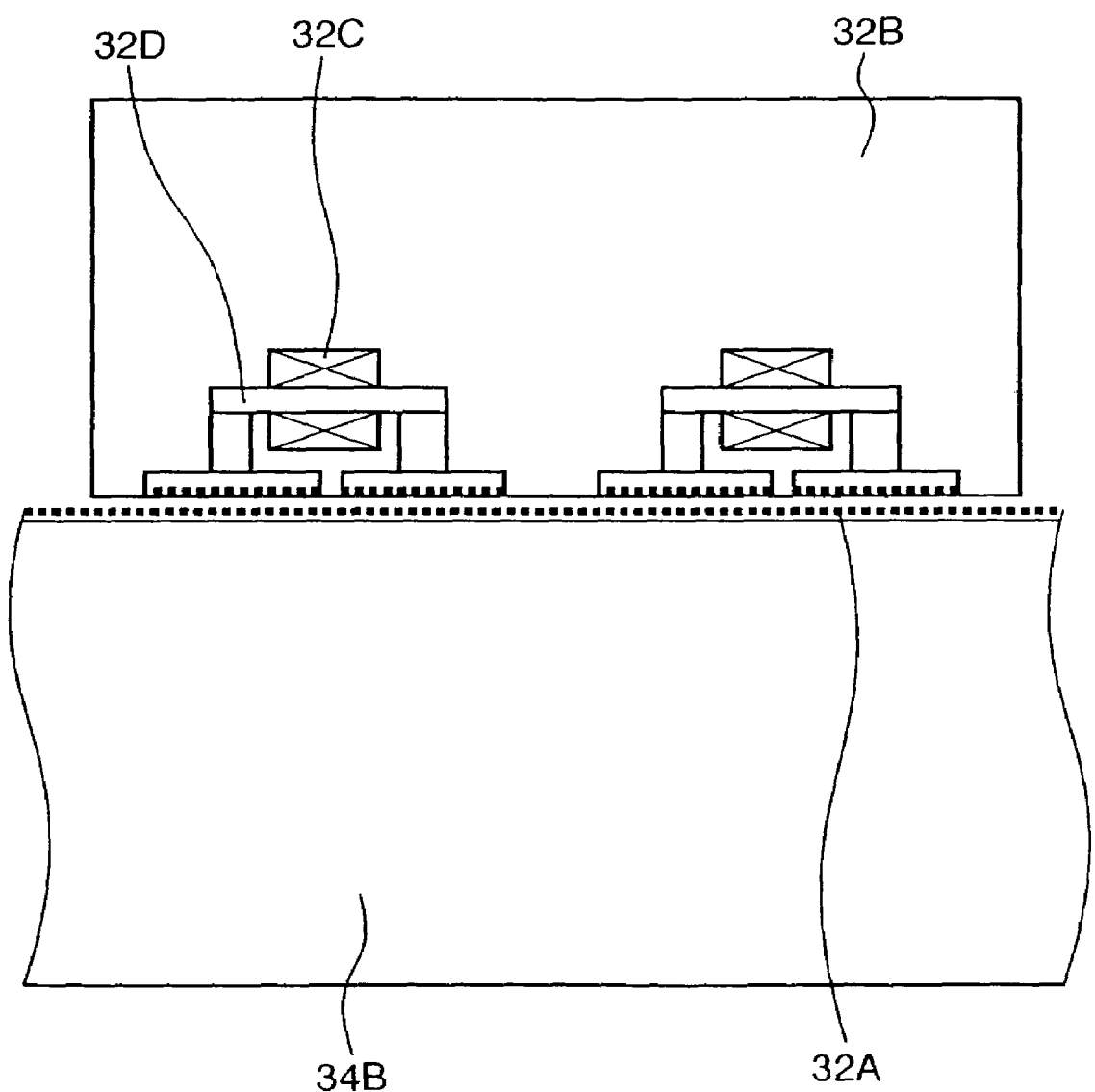
FIG. 16 is an enlarged view of a portion D of FIG. 15.

FIG. 16 is an enlarged view of a portion D of FIG. 15. A yoke 32D is excited by a driving coil 32C of the planar pulse motor slider 32B. The finger-like yoke of the yoke 32D is subjected to three-phase attracting force control (not shown) with respect to the finger-like pure-iron base of the planar pulse motor platen 32A arranged on the upper surface of the stage base 34B to generate an attracting force continuously. Then, the planar pulse motor slider 32B moves with respect to the planar pulse motor platen 32A.

In this planar pulse motor scheme as well, when first and second stages 12 and 13 are to be driven independently of each other (that is, when an exposure process and an alignment process are to be performed simultaneously), the first and second separate stage bases 34B and 34C are moved apart. When the positions of the first and second stages 12 and 13 are to be swapped, the first and second stage bases 34B and 34C are moved close to each other or brought into tight contact with each other, so that the first and second stages 12 and 13 are moved smoothly between the first and second stage bases 34B and 34C.

Fifth Embodiment

In the first to fourth embodiments, two stages are driven by planar pulse motors. In the fifth embodiment, two stages are driven by linear driving mechanisms. The fifth embodiment also includes two stage bases and stage base driving mechanisms (e.g., mounts equivalent to those described above), which drive the stage bases. When the two stages are to be driven independently of each other (that is, when an exposure process and an alignment process are to be performed simultaneously), the two stage bases are moved apart. When the positions of the two stages are to be swapped, the two stage bases are moved close to each other or brought into tight contact with each other, so that the two stages are moved smoothly between the two stage bases.

Matters that are not particularly referred to herein can follow the first to fourth embodiments.

A first slider 43A on which a stage for holding a wafer is mounted, a Y driving mechanism 43B which drives the first slider 43A in a Y direction, an X driving mechanism 43C which drives the Y driving mechanism 43B in the X direction to drive the first slider 43A in the X direction, and a first stage base 43D which supports the first slider 43A to be movable in an X-Y plane are arranged in an exposure process area.

A second slider 42A on which a stage for holding a wafer is mounted, a Y driving mechanism 42B which drives the second slider 42A in the Y direction, an X driving mechanism 42C which drives the Y driving mechanism 42B in the X direction to drive the second slider 42A in the X direction, and a second stage base 42D which supports the second slider 42A to be movable in the X-Y plane are arranged in an alignment process area.

Figure 17A:
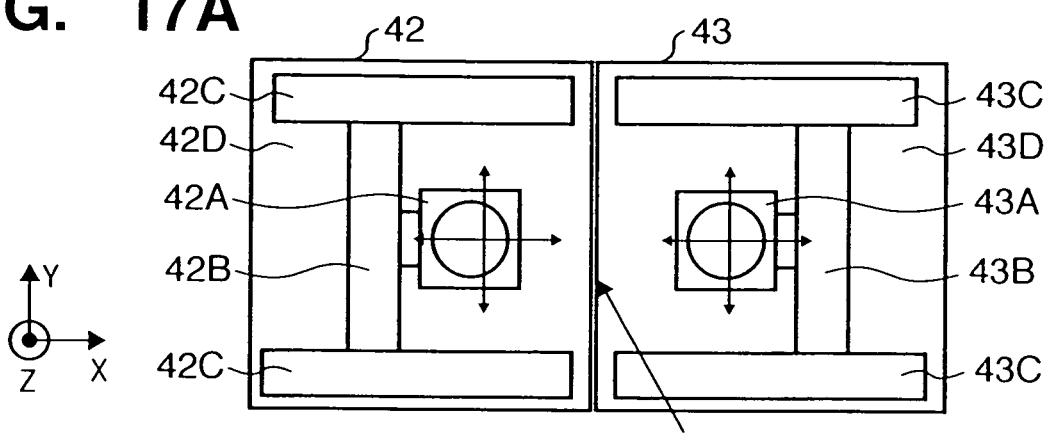
FIGS. 17A to 17D are views showing a stage swapping operation in the fifth embodiment.

In the above structure, while an exposure process takes place in the exposure process area and an alignment process takes place in the alignment process area, the first and second stage bases 43D and 42D are supported by mounts (corresponding to the mounts 4D described above) while they are spaced apart from each other, as shown in FIG. 17A. A reaction force and vibration which are generated when the two stages accelerate or decelerate are not transmitted between the two stages, and the two stages can be operated in atmospheres completely independent of each other.

When a wafer for which an alignment process (a process of detecting a mark position on the wafer for the purpose of alignment) has been ended in the alignment process area is to be moved to the exposure process area and when the wafer for which the exposure process has been ended in the exposure process area is to be recovered (assume that the wafer is recovered in the alignment process area), the positions of the two stages (sliders) must be swapped.

Figure 17B:
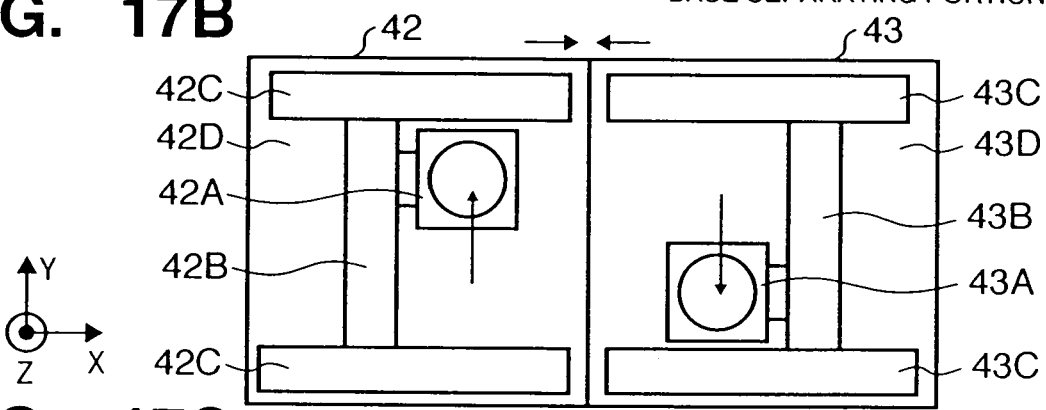
Figure 17C:
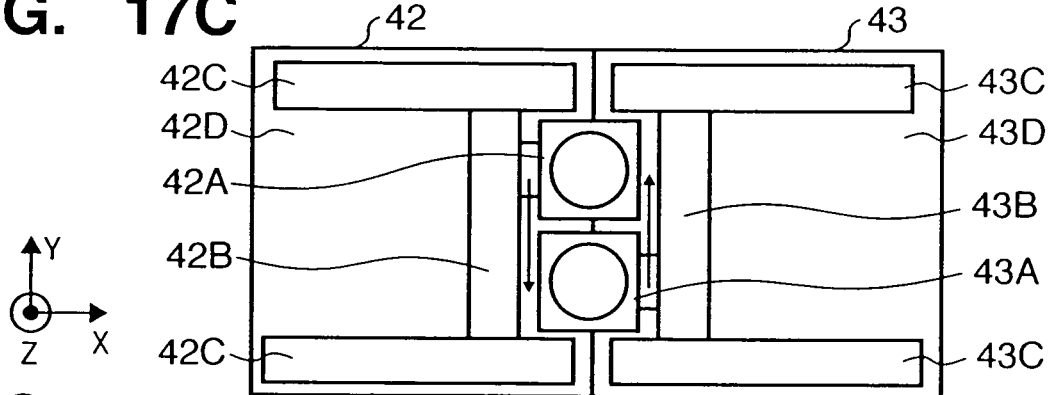
Figure 17D:
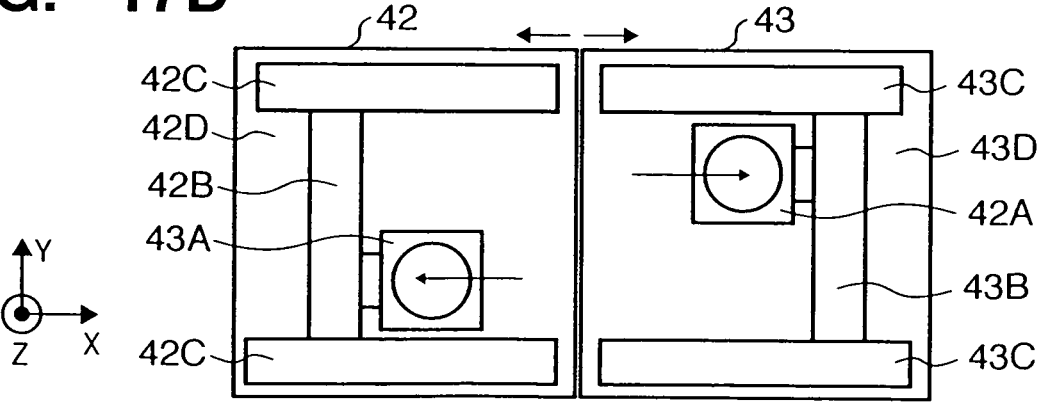

FIGS. 17B to 17D exemplify the swapping sequence of the two stages. First, as shown in FIG. 17B, the sliders 43A and 42A are moved to swap preparation positions, and the stage bases 43D and 42D are moved close to each other or brought into tight contact with each other by the mounts including the stage base driving mechanisms. In this case, position control and positioning of the stage bases 43D and 42D can follow the first to fourth embodiments.

Subsequently, as shown in FIG. 17C, while the stage bases 43D and 42D are close to each other or in tight contact with each other, the slider 42A is disconnected from the Y driving mechanism 42B, and the slider 43A is disconnected from the Y driving mechanism 43B. The slider 43A is connected to the Y driving mechanism 43B, and the slider 43A is connected to the Y driving mechanism 42B. Thus, the sliders are swapped between the Y driving mechanisms 42B and 43B.

As shown in FIG. 17D, the slider 42A is positioned in the exposure process area by the Y driving mechanism 43B and X driving mechanism 43C, and the slider 43A is positioned in the alignment process area by the Y driving mechanism 42B and X driving mechanism 42C. After that, an alignment process and exposure process are performed simultaneously.

Device Manufacturing Method

Figure 18:
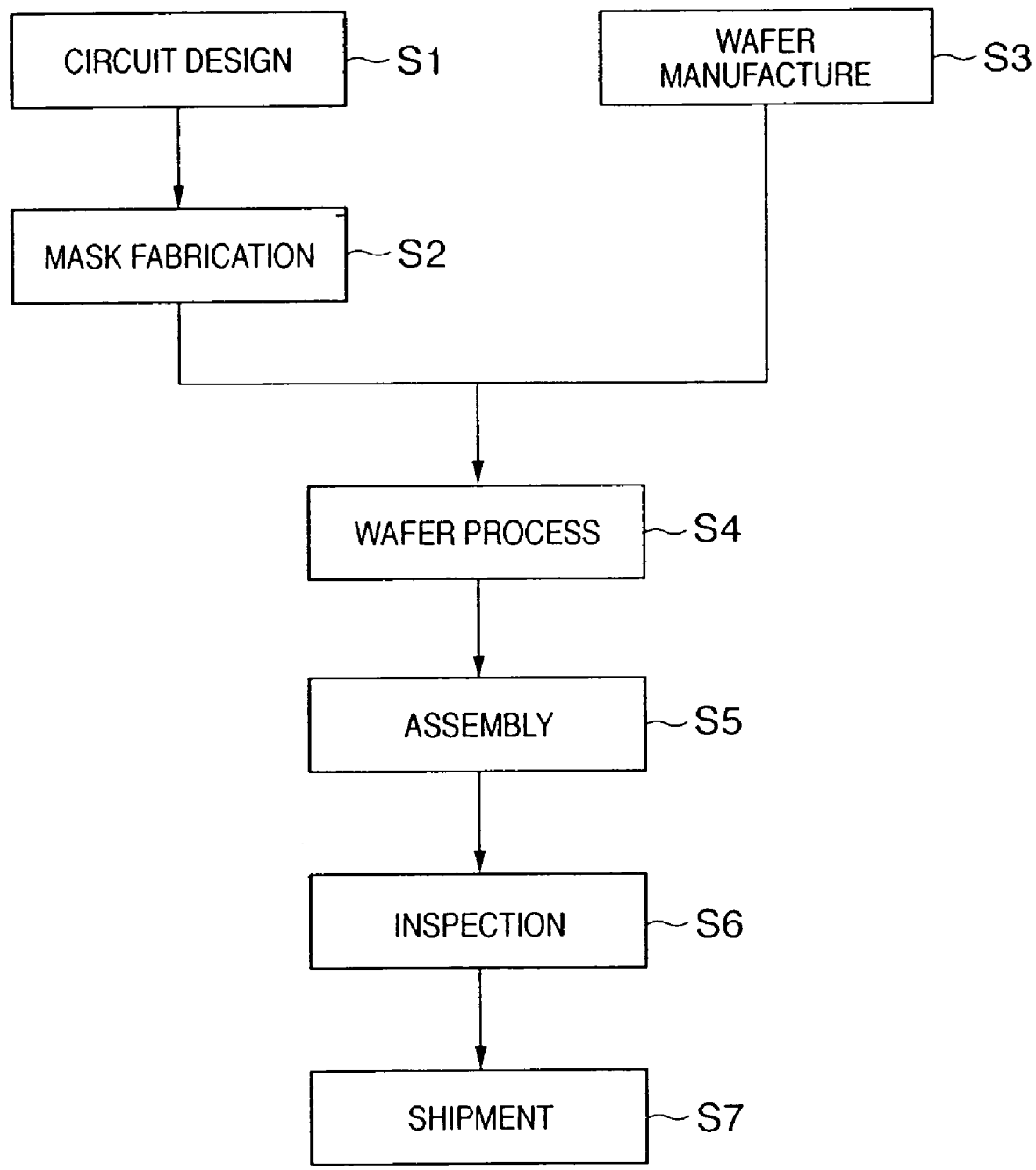
FIG. 18 is a flowchart showing the flow of an entire semiconductor device manufacturing process.

A semiconductor device manufacturing process, which uses the above exposure apparatus, will be described hereinafter. FIG. 18 is a flowchart showing the flow of the entire semiconductor device manufacturing process. In step 1 (circuit design), the circuit of a semiconductor device is designed. In step 2 (mask fabrication), a mask is fabricated on the basis of the designed circuit pattern. In step 3 (wafer manufacture), a wafer is manufactured using a material such as silicon. In step 4 (wafer process), called a preprocess, an actual circuit is formed on the wafer in accordance with lithography using the mask and wafer described above. In step 5 (assembly), called a post process, a semiconductor chip is formed from the wafer fabricated in step 4. This step includes processes such as assembly (dicing and bonding) and packaging (chip encapsulation). In step 6 (inspection), inspections such as an operation check test and a durability test of the semiconductor device fabricated in step 5 are performed. A semiconductor device is finished with these steps and shipped (step 7).

Figure 19:
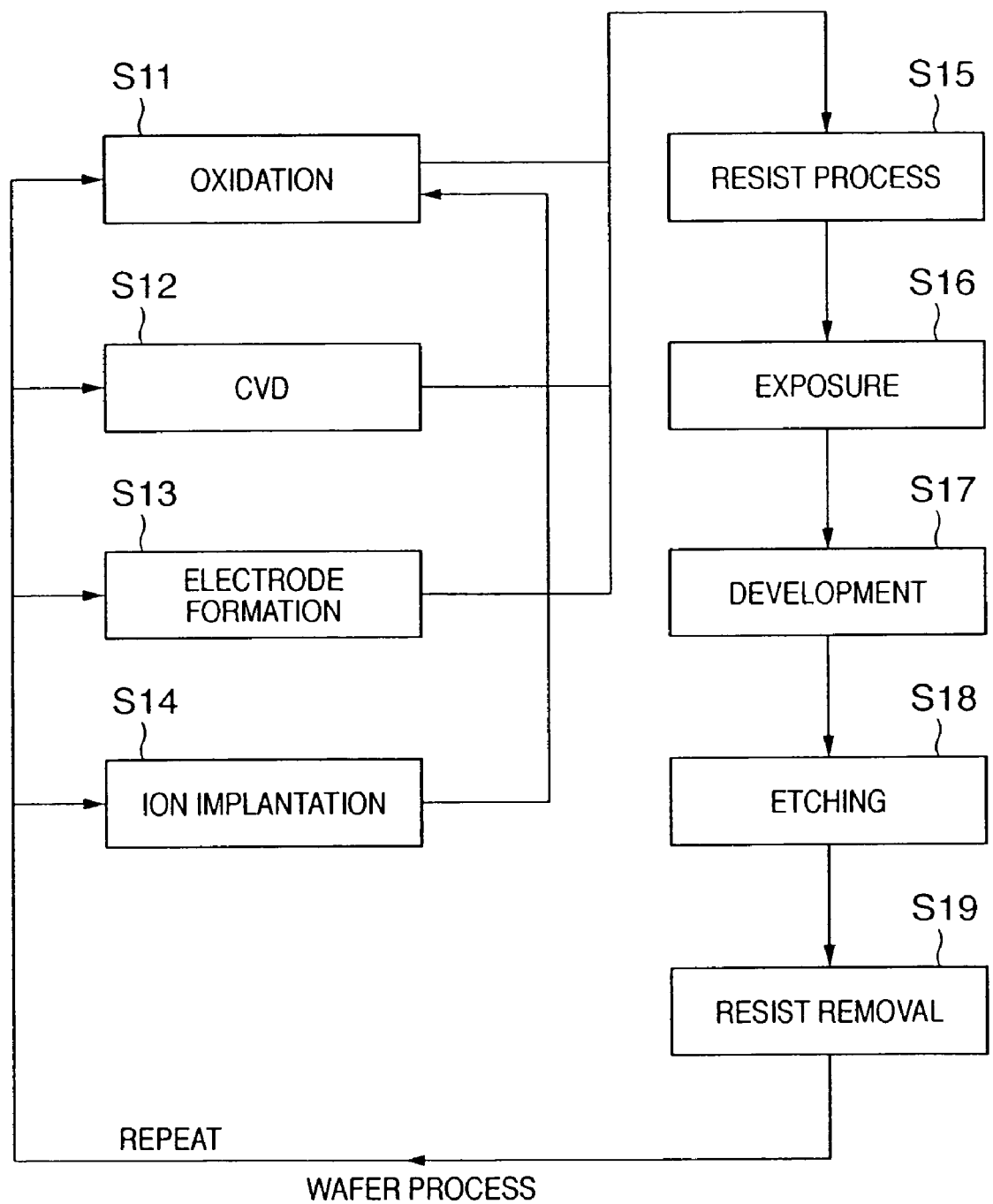
FIG. 19 is a flowchart showing the flow of a wafer process in detail.

FIG. 19 is a flowchart showing the flow of the above wafer process in detail. In step 11 (oxidation), the surface of the wafer is oxidized. In step 12 (CVD), an insulating film is formed on the wafer surface. In step 13 (electrode formation), an electrode is formed on the wafer by deposition. In step 14 (ion implantation), ions are implanted in the wafer. In step 15 (resist process), a photosensitive agent is applied to the wafer. In step 16 (exposure), a latent image of the circuit pattern is formed on the photosensitive agent on the wafer by the exposure apparatus described above. In step 17 (development), the exposed wafer is developed. In step 18 (etching), portions other than the developed resist image are removed. In step 19 (resist removal), any unnecessary resist after etching is removed. These steps are repeated to form multiple circuit patterns on the wafer.

As many apparent widely different embodiments of the present invention can be made without departing from the spirit and scope thereof, it is to be understood that the invention is not limited to the specific embodiments thereof except as defined in the claims.

CLAIM OF PRIORITY

This application claims priority from Japanese Patent Application No. 2004-146639, filed on May 17, 2004, the entire contents of which are hereby incorporated by reference herein.

What is claimed is:

1. A positioning apparatus comprising:
first and second bases; and
two moving elements which are guided by said first and second bases to move on said first and second bases, said two moving elements being supported on said first and second bases by air bearings,
wherein (i) a distance is ensured between said first and second bases, (ii) when said two moving elements move between said first and second bases, both a guide surface of said first base and a guide surface of said second bases are used, and (iii) pneumatic pressures of said air bearings are increased to be higher than that in a case wherein said moving elements move on said first and second bases.

2. The apparatus according to claim 1, further comprising:
a base driving mechanism which changes the distance between said first and second bases,
wherein said base driving mechanism ensures a predetermined distance between said first and second bases when one of said two moving elements moves on said first base and the other one of said two moving elements moves on said second base, and moves said first and second bases close to each other, when said two moving elements move between said first and second bases, such that the distance between said first and second bases is less than the predetermined distance.

3. The apparatus according to claim 2, further comprising a sensor which detects a relative positional relationship between said first and second bases, wherein said base driving mechanism is driven based on an output from said sensor.

4. The apparatus according to claim 2, wherein when said one moving element moves from said first base onto said second base, said other moving element moves from said second base onto said first base simultaneously.

5. The apparatus according to claim 1, wherein said moving elements are moved by an electromagnetic force that acts between said bases and said moving elements.

6. The apparatus according to claim 5, wherein said moving elements are moved between said first and second bases by an electromagnetic force that acts between said first and second bases and said moving elements.

7. The apparatus according to claim 2, further comprising a first driving mechanism which is connected to said one moving element on said first base to move said one moving element, and
a second driving mechanism which is connected to said other moving element on said second base to move said other moving element,
wherein said two moving elements are driven by said first and second driving mechanisms to move on and between said first and second bases.

8. An exposure apparatus which exposes a substrate coated with a photosensitive agent, the apparatus comprising:
a positioning apparatus which has first and second stages and holds and positions substrates on said first and second stages, and
a pattern forming portion which exposes the photosensitive agent on the substrate held on, of said first and second stages, a stage which is located in an exposure area, to form a latent pattern,
wherein said positioning apparatus comprises a positioning apparatus according to claim 1, and said first and second moving elements respectively include said first and second stages.

9. A device manufacturing method comprising:
a step of forming a latent pattern on a photosensitive agent applied to a substrate by using an exposure apparatus according to claim 8; and
a step of developing the latent pattern.

10. A positioning apparatus comprising:
first and second bases; and
two moving elements which are guided by said first and second bases to move on said first and second bases,
wherein a distance is ensured between said first and second bases, and when said two moving elements move between said first and second bases, both a guide surface of said first base and a guide surface of said second bases are used, and end portions of said guide surfaces of said first and second bases which oppose each other are chamfered.

11. A positioning apparatus comprising:
first and second bases;
two moving elements which are guided by said first and second bases to move on said first and second bases,
wherein a distance is ensured between said first and second bases, and when said two moving elements move between said first and second bases, both a guide surface of said first base and a guide surface of said second bases are used; and a base driving mechanism which changes the distance between said first and second bases, wherein said base driving mechanism ensures a predetermined distance between said first and second bases when one of said two moving elements moves on said first base and the other one of said two moving elements moves on said second base, and moves said first and second bases close to each other, when said two moving elements move between said first and second bases, such that the distance between said first and second bases is less than the predetermined distance,
wherein said first and second bases, respectively, have engaging portions, and when said first and second bases are driven by said base driving mechanism to become close to each other, said engaging portion of said first base engages with said engaging portion of said second base to position said first and second bases with respect to each other.

* * * * *

UNITED STATES PATENT AND TRADEMARK OFFICE
CERTIFICATE OF CORRECTION

PATENT NO. : 7,289,194 B2  Page 1 of 1
APPLICATION NO. : 11/127154
DATED : October 30, 2007
INVENTOR(S) : Yoshikazu Miyajima It is certified that error appears in the above-identified patent and that said Letters Patent is hereby corrected as shown below:

ON THE COVER PAGE:
In item "(57) ABSTRACT," line 8, "bases" should read -- base --.

COLUMN 6:
Line 13, ".FIG. 4" should read -- FIG. 4 --.

COLUMN 7:
Line 6, "motors coil" should read -- motor coils --.

COLUMN 9:
Line 53, "an" should be deleted.

COLUMN 13:
Line 9, "slider 43A" should read -- slider 42A --.

COLUMN 14:
Line 12, "bases" should read -- base --.

COLUMN 15:
Line 14, "bases" should read -- base --.

COLUMN 16:
Line 2, "bases" should read -- base --.

Signed and Sealed this

Seventeenth Day of June, 2008

JON W. DUDAS
*Director of the United States Patent and Trademark Office*